(12) United States Patent
Schoessow

(10) Patent No.: US 10,284,154 B1
(45) Date of Patent: May 7, 2019

(54) SYSTEM AND METHOD FOR GENERATING HIGH-VOLTAGE RADIO FREQUENCY SIGNALS USING AN ELECTRONICALLY TUNED RESONATOR

(71) Applicant: Agilent Technologies, Inc., Santa Clara, CA (US)

(72) Inventor: Michael Schoessow, Belmont, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/836,191

(22) Filed: Dec. 8, 2017

(51) Int. Cl.
  *H03F 3/191* (2006.01)
  *H03F 1/30* (2006.01)
  *H03F 3/343* (2006.01)

(52) U.S. Cl.
  CPC .............. *H03F 3/191* (2013.01); *H03F 1/30* (2013.01); *H03F 3/343* (2013.01); *H03F 2200/138* (2013.01); *H03F 2200/147* (2013.01); *H03F 2200/451* (2013.01); *H03F 2200/468* (2013.01); *H03F 2200/531* (2013.01); *H03F 2203/45286* (2013.01)

(58) Field of Classification Search
  CPC ....................................... H03F 3/191

USPC ......................................... 330/302
See application file for complete search history.

(56) References Cited

U.S. PATENT DOCUMENTS

| | | | |
|---|---|---|---|
| 5,084,682 A * | 1/1992 | Swenson | H05H 7/02 315/5.41 |
| 2004/0124937 A1 * | 7/2004 | Han | H03L 1/026 331/176 |
| 2007/0249304 A1 * | 10/2007 | Snelgrove | H03F 1/0205 455/127.2 |

* cited by examiner

*Primary Examiner* — Joseph Chang

(57) ABSTRACT

A system for generating a radio frequency (RF) signal at a drive frequency and a high voltage. The system includes a RF amplifier to amplify the voltage of a drive signal having a selected RF frequency. The amplified drive signal is used to drive a resonator to generate the RF signal such that the resonant frequency is the same or substantially the same as the drive frequency. A resonance tuning controller compares the drive frequency and the resonant frequency. If the resonant frequency and drive frequency are different, a temperature changing element is controlled to either increase heat or decrease heat radiating toward a tuning component with a resonance parameter that varies with temperature. For example, the heat may change the capacitance of the tuning capacitor causing a change in the resonant frequency of the resonator.

20 Claims, 14 Drawing Sheets

SYSTEM AND METHOD FOR GENERATING HIGH-VOLTAGE RADIO FREQUENCY SIGNALS USING AN ELECTRONICALLY TUNED RESONATOR

TECHNICAL FIELD

The present invention relates to systems and methods for generating high-voltage radio frequency signals, and more particularly to systems and methods that tune a resonant frequency to remain equal or substantially equal to a drive frequency.

BACKGROUND

Certain instruments and products require a precise source of very high-voltage radio-frequency sine waves. One example is a mass spectrometer, in which the high-voltage RF source drives a substantially capacitive load consisting of a multi-polar (or "multipole") electrode assembly such as a multi-polar rod assembly. One particular example is a quadrupole (or "quad"), which is formed by two pairs of rods each receiving a RF signal to generate a RF electric field in an interior space within the quad. The RF electric field focuses ions into an ion beam at the central axis of the space. The ions enter the space at one end of the space and travel along the central axis exiting at the opposite end of the space. In some implementations, a DC component is added to the RF signal at each rod pair to provide an ion mass bandpass filter.

The high voltage is typically generated using an oscillator to drive a radio-frequency power amplifier, which in turn drives a high-Q LC resonator tuned to the same frequency as the oscillator. The resonator magnifies the drive voltage from the power amplifier to produce the necessary high voltage. For a given instrument running a particular experiment, the desired frequency is normally fixed. The amplitude however must be settable over a wide range, such as for example 50V to 8 kVpp (peak-to-peak amplitude).

The use of a resonator driven by the RF amplifier advantageously allows the capacitance of the load to effectively operate as the majority of the circuit capacitance resonating with the inductance of the resonator. This substantially reduces the required power from the amplifier (typically by one to two orders of magnitude).

One problem with using the resonator with the RF amplifier is that the resonator frequency tends to drift. That is, the frequency to which the resonator is tuned changes over time. The result of this drift is that the resonator frequency no longer matches the oscillator, or drive frequency. When the resonator frequency fails to match the drive frequency, the voltage magnification factor provided by the resonator decreases. The magnification factor decrease results in a decrease in the high-voltage amplitude, which is problematic for spectrometer operation.

The amplitude may be maintained constant using a feedback based circuit called a leveling loop. This common technique understood by those skilled in the art increases the amplitude of the oscillator signal being fed to the power amplifier input. This increases the amplifier output power to compensate for the reduced magnification factor from the out-of-tune resonator. The leveling loop is effective at keeping the high-voltage amplitude constant as long as the resonator frequency has not drifted more than about 0.5%, which corresponds to a capacitance or inductance change of about 1%. It would be desirable to cope with capacitor or inductor resonance changes over a range of greater than 1% without resorting to unreasonably large and expensive amplifiers that may raise other related issues.

The frequency drift in resonator-based RF drivers is mostly temperature related. The resonator physically heats up or cools down. The temperature changes may be the result of instrument components heating up and cooling down, the resonator itself dissipating power, and ambient air temperature changes. The resonator expands and contracts, which causes the inductance to increase and decrease respectively. The resonant frequency changes inversely with the square root of inductance. Thermally induced capacitance changes also occur.

Even with great care, it is not practicable to completely eliminate inductance and capacitance change over time. In the present state of the art the inductance change is minimized to the extent that is reasonable cost-wise, and then the effects of the remaining resonator frequency drift are dealt with via a leveling loop and a moderately over-sized power amplifier.

One solution involves mounting a variable speed fan under control of a field-programmable gate array in the housing of the mass spectrometer near the resonator to reduce temperature changes. Adding a fan however requires that additional space be provided. It may also be necessary to address added electrical and audible noise when the fan is switched on during operation. Also, a fan cannot eliminate temperature changes; it can only reduce the range of change.

Therefore, it would be desirable to minimize or even eliminate the frequency drift without requiring larger and more costly amplifiers, or electromechanical components that could introduce noise into the system.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one embodiment, a system for generating a radio frequency (RF) output signal at a high voltage includes: an oscillator configured to generate a drive signal at a drive frequency. A RF amplifier is configured to amplify the drive signal to generate an amplified drive signal at the drive frequency. The RF amplifier output is connected to a resonator, which includes a tuning component connected to receive the amplified drive signal from the RF amplifier. The amplified drive signal drives the resonator to generate the RF output signal at a high amplitude based at least in part on a resonance parameter of the tuning component that varies with a tuning component temperature. The resonant frequency is kept substantially equal to the drive frequency depending on the tuning component temperature. The RF output signal has an amplified amplitude. A temperature-changing element is configured to heat or cool the tuning component to change the tuning component temperature. A resonance tuning controller is configured to detect when the resonant frequency and the drive frequency are different, and to control the temperature changing element to change the resonance parameter to tune the resonant frequency to be substantially equal to the drive frequency.

According to another embodiment, a method is provided for generating a radio frequency ("RF") output signal at a high voltage. An amplified drive signal is generated using an RF amplifier connected to an oscillator generating an RF signal at a drive frequency. The amplified drive signal drives a resonator to generate the RF output signal at the drive frequency and at a high voltage due to the resonant voltage magnification or step-up provided by the resonator when the resonant frequency is substantially equal to the drive frequency. When a difference between the resonant frequency and the drive frequency is detected, the tuning component in the resonator is heated or cooled to adjust the tuning component temperature to tune the resonator frequency to be substantially equal to the drive frequency.

According to another embodiment, a RF output signal generator is configured for performing any of the methods disclosed herein.

According to another embodiment, an electrode assembly includes: a system for generating a radio frequency (RF) output signal according to any of the embodiments disclosed herein; and a plurality of electrodes, wherein one or more of the electrodes communicate with the system and are configured to receive the RF output signal.

According to another embodiment, an ion processing device includes: an electrode assembly according to any of the embodiments disclosed herein; and a vacuum chamber, wherein the plurality of electrodes is positioned in the vacuum chamber.

According to another embodiment, a mass spectrometer (MS) includes: an electrode assembly according to any of the embodiments disclosed herein; and an ion detector.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Disclosed herein are systems and methods for generating radio frequency (RF) signals at high voltages. The systems and methods described herein may be used in any application or environment in which a RF signal is needed at a desired frequency and high voltage. Reference may be made in the description below to the use of the systems and methods in the context of mass spectrometers where such reference enhances or clarifies the description. It is to be understood however, that the systems and methods described herein may find advantageous use in any application involving a high-voltage RF signal.

In general, a high-voltage RF signal is any signal in the RF spectrum having a signal amplitude level in which a resonator is coupled to the RF amplifier output to magnify the drive voltage of the RF amplifier output. The actual values that may be considered "high voltage" values in any specific implementation may depend on the RF amplifier used and the need for adding a resonator to magnify the voltage to the desired level. In some implementations, a "high voltage" may be greater than 50 $V_{pp}$ (peak-to-peak amplitude) and as high as 8k $V_{pp}$. Other implementations may operate at higher voltages.

Figure 1:
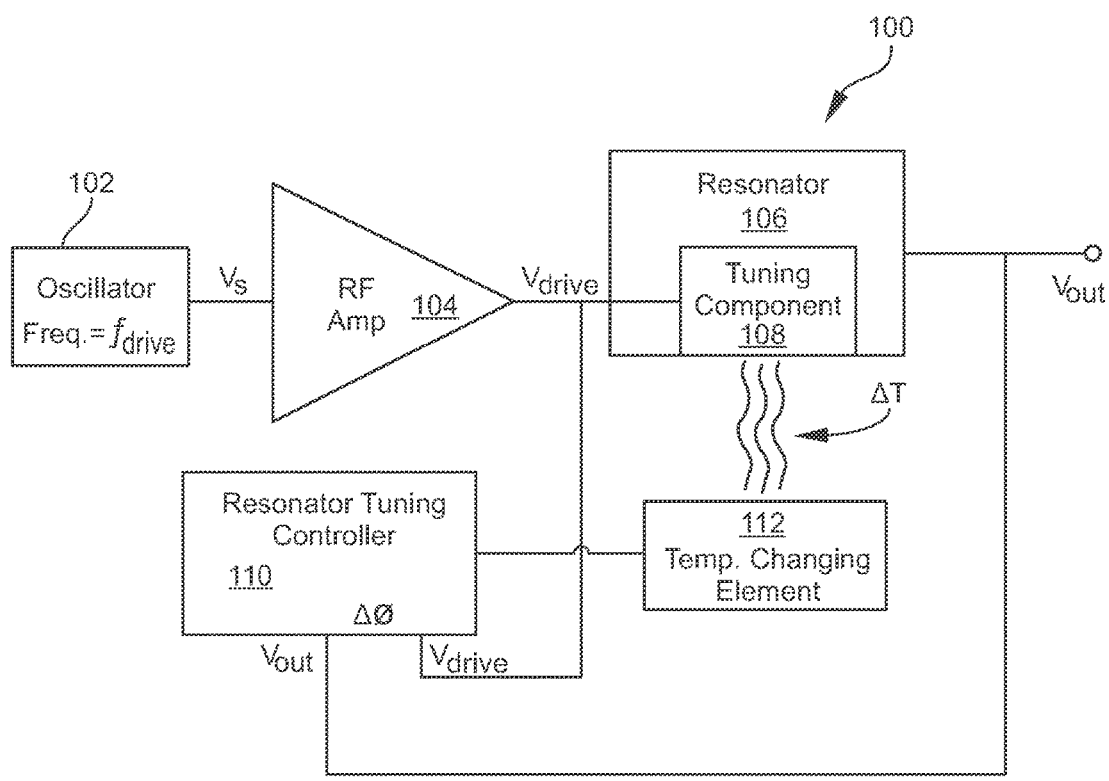
FIG. 1 is a block diagram of an example of a system for generating a RF output signal at a high voltage according to an embodiment disclosed herein.

FIG. 1 is a block diagram of an example of a system 100 for generating a RF output signal at a high voltage (which may also be referred to as a high-voltage RF signal generating system). The system 100 includes an oscillator 102, a RF amplifier 104, a resonator 106, a tuning component 108, a resonator tuning controller 110, and a temperature changing element 112. The oscillator 102 may be any suitable electronic element or circuit configured to generate a drive signal at a drive frequency. The drive frequency is the frequency value of the RF signal generated by the system 100. The drive signal is amplified and connected to drive the resonator 106, which is configured to operate at a resonant frequency equal to the drive frequency. The oscillator 102 may be implemented using any suitable harmonic oscillator configuration. Example implementations include a feedback oscillator, such as a crystal oscillator, an LC oscillator, and a RC oscillator (to the extent a sufficiently high frequency can be generated). In other implementations, a negative resistance oscillator may be used. The oscillator 102 may be configured to generate a RF signal, $V_s$, at a single desired drive frequency value, $f_{drive}$. The oscillator 102 may be implemented using a multi-frequency generator using, for example a voltage-controlled oscillator, a frequency synthesizer, or any other suitable device that generates an oscillating signal. In one implementation, the oscillator 102 is a function provided by, or a component of, the resonator tuning controller 110.

The oscillator 102 is connected to the RF amplifier 104, which is configured to amplify the drive signal, $V_s$, to generate an amplified drive signal, $V_{drive}$, at the drive frequency value, $f_{drive}$. The RF amplifier 104 may be implemented using any suitable RF amplifier system. In an example implementation, the RF amplifier 104 uses a high-power voltage supply to enable amplification of the voltage of the drive signal to a suitable level. In some example implementations, the oscillator 102 operates separately from the RF amplifier 104 as a different unit. In other example implementations, the RF amplifier 104 and oscillator 102 may be different functional units of the same system for generating high-power RF signals. The oscillator 102 may be part of a sub-system that permits selection of different frequencies, for example. The RF amplifier 104 may also provide for amplification at selectable levels. The RF amplifier 104 may also include suitable impedance matching elements to maximize power transfer into the resonator 106. In an example implementation, the RF amplifier 104 is a differential amplifier with each differential output connected to independently configured resonators to generate two high-voltage RF outputs that are equal in amplitude to each other and are 180 degrees different in phase from each other. In the examples described below, a differential amplifier implementation would include a resonator with a tuning component connected to each differential output to generate the RF output signal across the voltage outputs of the two resonators.

The RF amplifier 104 generates an amplified drive signal at the drive frequency, $f_{drive}$, and at the desired amplified voltage. The resonator 106 is connected to the RF amplifier 104 to receive the amplified drive signal, which drives the resonator 104 to generate the RF output signal, $V_{out}$ at the drive frequency value, $f_{drive}$. The resonant frequency, $f_{res}$, is based on a resonance parameter of a tuning component 108 that varies with a tuning component temperature. The resonator 106 may be implemented using a LC resonant circuit, an RC resonant circuit (to the extent the RC resonant circuit can operate at the desired frequency level), an RLC resonant circuit, or any other suitable resonating assembly that includes a tuning component 108. A tuning component 108 may be any component having a resonance parameter, or a parameter having a value that affects the resonant frequency of the resonator 106. For example, the tuning component 108 may be an inductor or a capacitor, which are components commonly used in resonant circuits. The resonance parameter may then be the inductance, or the capacitance, respectively.

It is noted that the tuning component 108 is a component of the resonator 106. The reactance of the tuning component 108 determines the resonant frequency of the resonator 106. It is the resonance parameter associated with the tuning component 108 that is adjusted in order to tune the resonant frequency. The tuning component 108 may, however, be located separately from the other components that form the resonator 106 in order to bring the tuning component 108 in sufficient proximity to the temperature changing element 112 to affect the temperature of the tuning component 108. For purposes of this description, it is to be understood that applying heat or cooling to the resonator 106, shall mean the same as applying heat to the tuning component 108 or cooling the tuning component 108.

The resonance parameters of typical tuning components may be variable within some range depending on the temperature of the environment in which the component operates. In some implementations, the tuning component 108 is a capacitor (i.e., a tuning capacitor) and the resonance parameter is the capacitance of the tuning capacitor. The tuning capacitor may be specified as having a temperature coefficient indicating a variability of capacitance per degree change in temperature. Inductors may similarly be characterized as having a temperature coefficient indicating a variability of inductance per degree change in temperature.

The resonator 106 is configured to magnify the RF output signal, $V_{out}$, at the drive frequency, $f_{drive}$ when the resonant frequency, $f_{res}$, is substantially equal to the drive frequency, $f_{drive}$. The resonant frequency, $f_{res}$, may vary with changes in the tuning component temperature. Thus, the amount of voltage magnification provided by the resonator 106 is dependent upon the state of tune of the resonator 106 and therefore is dependent upon the tuning component temperature. The temperature changing element 112 is configured to radiate heat or to cool the tuning component 108 to change the tuning component temperature in response to a temperature control signal. The temperature changing element 112 is mounted in the system 100 at a location that allows the heating or cooling from the temperature changing element 112 to affect the temperature of the tuning component 108. In an example implementation, the temperature changing element 112 is a resistor that radiates heat depending on the amount of current flowing through the resistor. The size, resistance and specific material of the resistor may be selected depending on the arrangement of the components in an enclosure of the system 100, the proximity of the temperature changing element 112 to the tuning component 108, and other factors specific to the implementation. In another example implementation, the temperature changing element 112 is a thermoelectric generator (e.g., a Peltier device) for heating or cooling the tuning component 108. A suitable thermoelectric generator may be used to either heat or cool the tuning component 108 depending on the electrical signal conducted to the thermoelectric generator. In other implementations, other heating and/or cooling devices may be used for the temperature changing element 112.

In the example shown in FIG. 1, the temperature control signal is provided to the temperature changing element 112 by the resonance tuning controller 110. The resonance tuning controller 110 may be configured to detect when the resonant frequency, $f_{res}$, and the drive frequency, $f_{drive}$ are different frequency values. If the resonant frequency, $f_{res}$, and the drive frequency, $f_{drive}$, are different, the resonance tuning controller 110 controls the temperature control signal to change the resonance parameter to tune the resonant frequency, $f_{res}$, to be equal, or at least substantially equal, to the drive frequency, $f_{drive}$. In the present context, "substantially equal" means some narrow range spanning values below and above the exact value of the drive frequency, $f_{drive}$, where the size of the range is acceptable for the operating environment in which the system 100 is implemented. As one non-limiting example, "substantially equal" means equal to the drive frequency, $f_{drive}$, plus or minus three degrees (±3°) of phase. As another non-limiting example, "substantially equal" means equal to the drive frequency, $f_{drive}$, plus or minus 4 kHz.

The resonance tuning controller 110 may use a feedback control technique to adjust the temperature control signal using a detection of when the resonant frequency is different from the drive frequency. In one example, the resonance tuning controller 110 may detect the phase difference between the drive voltage ($V_{drive}$) and the output voltage ($V_{out}$) as feedback for adjusting the temperature control signal. In another example, a dead reckoning system may be used where the resonance tuning controller 110 includes a map of power levels and corresponding temperature changes at those power levels. The temperature changes may then be mapped to reactance values to which the tuning component 108 may be set to tune the resonant frequency.

The temperature control signal conducted to the temperature changing element 112 depends on the device used in implementing the temperature changing element 112. Where the temperature changing element 112 is a resistor configured to generate heat, the temperature control signal is a current or voltage level, depending on circuit details. The temperature changing element 112 may also be a thermoelectric generator, such as for example, a Peltier heater, a Peltier cooler, or a heat pump. The thermoelectric generator may be configured to heat or cool the tuning component 108 depending on the temperature control signal conducted to the thermoelectric generator.

In an example implementation, the resonance tuning controller 110 may include a field-programmable gate array (FPGA) programmed to detect a difference between the resonant frequency, $f_{res}$, and the drive frequency, $f_{drive}$, and to control the temperature control signal to change the resonance parameter to tune the resonant frequency, $f_{res}$, to be substantially equal to the drive frequency, $f_{drive}$. In another implementation, the resonance tuning controller 110 may be implemented as a function performed by a general-purpose controller unit that may provide control functions for other systems or sub-systems. For example, the system 100 for generating the high-voltage RF signal may operate in a mass spectrometer that uses a processor for a variety of systems or sub-systems in the mass spectrometer. In another implementation, the resonance tuning controller 110 may be implemented using any suitable control element that may or may not use any type of processor resources. For example, an analog solution may be implemented in which the difference between the resonant frequency and drive frequency is detected (using a circuit with a comparator for example), and the difference may trigger a circuit to generate a suitable signal level to drive the temperature changing element. In an example implementation, the resonance tuning controller 110 may also include an oscillator function that operates as the oscillator 102 in FIG. 1.

Figure 2A:
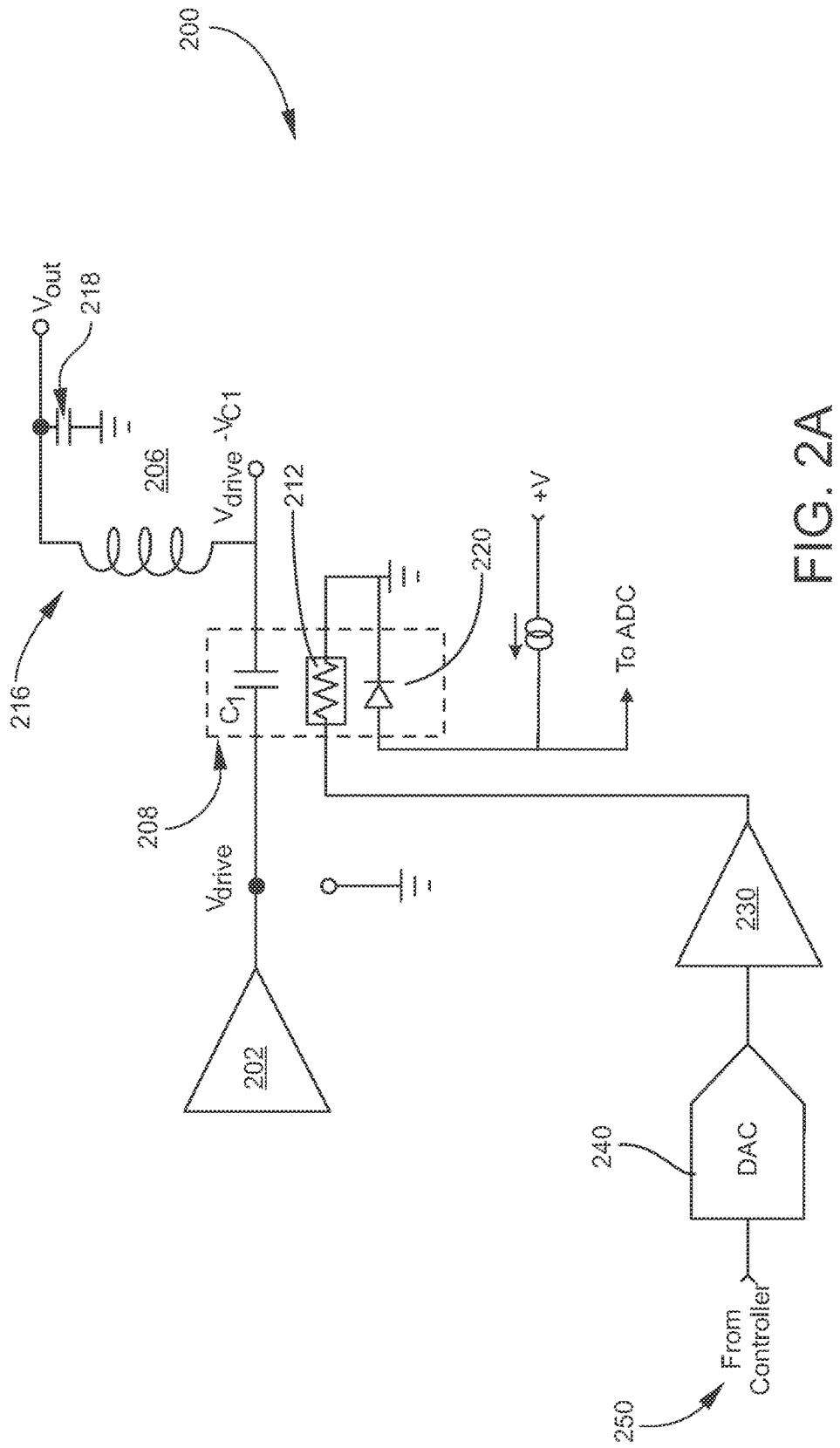
FIG. 2A is a schematic diagram of an example implementation of the system in FIG. 1 using a series resonant circuit.

FIG. 2A is a schematic diagram of a high-voltage RF signal generating system 200 that is an example implementation of the system 100 in FIG. 1. The system 200 includes a RF amplifier 202 connected to a series LC resonant circuit 206 that includes a tuning component implemented as using a tuning capacitor 208. The tuning capacitor 208 is connected to and contributes to the capacitance of the LC resonator 206, which also includes an inductor 216 and a capacitor 218. Although the tuning capacitor 208 in this example is shown connected in series with the inductor 216 and the capacitor 218, it will be understood that the tuning capacitor 208 could be connected in any configuration that allows it to influence the resonance frequency. The tuning capacitor 208 could, for example, be connected in parallel with capacitor 218. The RF amplifier 202 may include an internal oscillator or receive an oscillating signal from a suitable source (not shown in FIG. 2A). The RF amplifier 202 generates an amplified drive signal, $V_{drive}$, to drive the LC resonator 206. The tuning capacitor 208 is in series connection with the output of the RF amplifier 202. The LC resonator 206 connects to the tuning capacitor 208 at one end of the inductor 216, which connects in series with the capacitor 218 to ground.

The tuning capacitor 208 may be positioned in the system in substantial proximity with a temperature changing element 212 and a temperature monitoring element 220 to enable the temperature changing element 212 to affect the tuning component temperature, which may be understood to be the temperature at which the tuning capacitor 208 operates. The temperature monitoring element 220 is positioned to sense heat radiated from the temperature changing element 112. The temperature monitoring element 220 may generate an electrical signal level corresponding to the sensed heat from, or temperature of, the temperature changing element 112. The electrical signal level may be used as feedback in a control loop that adjusts the temperature control signal based on the electrical signal level indicating the temperature of the temperature changing element 212. In an example implementation, the temperature monitoring element 220 may be any suitable transducer that generates an electrical signal in response to a temperature level, or temperature change. In one implementation as shown in FIG. 2A, the temperature monitoring element 220 may be a temperature sensitive diode.

The system 200 in FIG. 2A includes a digital-to-analog-converter ("DAC") 240 connected to receive a digital signal from a controller 250. The DAC 240 converts the digital signal to a voltage level, which is provided to a DC amplifier 230, which provides a voltage that causes current to flow through the temperature changing element 212. The controller 250 may vary the digital signal provided to the DAC 240 in a manner that varies the voltage output from the DC amplifier 230 and therefore the current flow through the temperature changing element 212 to radiate heat towards the tuning capacitor 208, as needed to change the capacitance of the tuning capacitor 208.

Alternatively, the controller 250 could output a variable pulse-width signal and the DAC 240 could be replaced with a simple low-pass filter to convert the variable pulse-width signal into a variable DC voltage to drive the DC amplifier 230.

The following description with reference to FIG. 2A illustrates operation of the system 200 for a specific example implementation. The description uses specific capacitance values and capacitor specifications, and makes other assumptions for operation in an example implementation for a given set of requirements. It is to be understood that these values, specifications, and assumptions are examples used for purposes of clarifying the description of the operation of the system 200 in FIG. 2A. These values, specifications, and assumptions are in no way intended for purposes of limitation.

The purpose of the system 200 in FIG. 2A is to generate a RF output signal at output, $V_{out}$, where the RF output signal has a desired frequency and a desired high-voltage level. The system 200 operates by driving the LC resonator 206 with the output of the RF amplifier 202. Through careful selection of the capacitance and specification of the tuning capacitor 208, the frequency and amplitude of the RF output signal may be maintained at the desired levels. For purposes of discussion, it is desired that the system 200 generate a RF output signal at a frequency of 1.6 Mhz.

The tuning capacitor 208 in the example in FIG. 2A is a thermally-tuned capacitor specified to have a desired temperature coefficient. The capacitor 208 may use a suitable ceramic (e.g., porcelain, etc.), or a suitable polymer (e.g., polypropylene) as the dielectric material, although any dielectric material specified as having a specified temperature change in response to temperature may be used as well. In this example, the tuning capacitor 208 is one having an N2800 temperature coefficient. The capacitance changes by 2800 parts per million per degree centigrade in a negative direction (capacitance goes down as temperature increases). The temperature range in the operating environment of the system 200 may be determined in specific implementations. For this example, the tuning capacitor 208 may be assumed to be operating in an environment with a temperature range from about 35° C. to about 110° C. The lower temperature limit may depend on the position of the tuning capacitor 208 in the system 200. The tuning capacitor 208 may be mounted, for example, in a location that receives direct outside air. The upper limit may be affected by the maximum temperature at which the temperature changing element 212 may heat the tuning capacitor 208. For example, the temperature changing element 212 may be configured to heat the tuning capacitor 208 to 110° C. In this example, the total temperature range is 75° C.

Given a temperature coefficient of 2800 ppm, the capacitance may change by 2800×75° C.=210,000 ppm over the 75° C. operating temperature range. The frequency range at which the resonant frequency of the LC resonator 206 may be controlled may be determined using specific capacitance values for the capacitance in the LC resonator 206. The resonator capacitance 218 in FIG. 2A has a capacitance value of 68 pF as an example. The tuning capacitor 208 in FIG. 2A has a capacitance of 1000 pF as an example. Given these values for the resonator capacitor 218 and the tuning capacitor 208, the total capacitance for determining the resonant frequency of the LC resonator 206 may be determined to be $$\frac{68(1000)}{68+1000} = 63.670 \text{ pF}.$$

With maximum heating of the capacitor the 1000 pF will have decreased to 1000−0.21(1000)=790 pF and 790 pF in series with 68 pF is 62.611 pF. With a nominal operating frequency of 1.6 MHz and a capacitance range of 62.611 pF to 63.670 pF, the range of the resonant frequency at which the LC resonator 206 may operate over the 75° C. temperature range is from 1.6 MHz to $$\sqrt{\frac{63.670}{62.611}} \times 1.6 \text{ Mhz.} = 1.6135 \text{ Mhz.}$$

The tuning range of the system 200 using the tuning capacitor 208 as described above is therefore 11.35 khz.

It is noted that the tuning range may be increased by reducing the capacitance of the tuning capacitor 208. A smaller capacitance results in a larger voltage drop across the tuning capacitor 208. Some implementations, such as the use of the system 200 as a driver of a quadrupole in a mass spectrometer, may be sensitive to drops in voltage level. The required tuning range may be reduced by including a resonator fan and varying the resonator fan speed as the temperature changes, or in response to the frequency drift. The tuning range may also be increased by including a heating and cooling element as the temperature changing element 212.

The description above illustrates how, by selecting the tuning capacitor 208 based on the capacitance and the temperature coefficient, a tuning range may be determined for a desired resonant frequency, $f_{res}$. The difference between the resonant frequency, $f_{res}$, and the drive frequency, $f_{drive}$, is monitored and when a difference is detected, the temperature changing element 212 may be controlled to heat the tuning capacitor 208 to vary the capacitance of the tuning capacitor 208, which adjusts the resonant frequency, $f_{res}$, of the LC resonator 206.

Various techniques may be used to detect when the resonant frequency, $f_{res}$, and the drive frequency, $f_{drive}$, are different frequency values. In general, the resonant frequency, $f_{res}$, and the drive frequency, $f_{drive}$, may be monitored to determine if the frequencies are the same or different. For example, the frequencies may be monitored to determine if they are the same frequency value by comparing the phase of the signal at the resonator output, $V_{out}$, with the phase of the signal at the RF amplifier output, $V_{drive}$, in FIG. 2A. If the resonant frequency, $f_{res}$, is the same as the drive frequency, $f_{drive}$, the phase at $V_{drive}$ will differ from the phase at $V_{out}$ by 90°. The signals at $V_{drive}$ and at $V_{out}$ may be monitored to determine if the phase shift between $V_{drive}$ and $V_{out}$ is greater than or less than 90°. Since the capacitor element of 208 is directly in series with capacitor 218 the phase of the voltage across the capacitor element 208 will be the same as the phase of the voltage, $V_{out}$, across capacitor 218. It may be more convenient to monitor the phase at the voltage $V_{drive}$−$V_{C1}$ instead of at $V_{out}$ because the magnitude of $V_{out}$ is typically too high for convenient monitoring while ($V_{drive}$−$V_{C1}$) is much lower and convenient to monitor. Knowing the phase difference between $V_{drive}$ and ($V_{drive}$−$V_{C1}$), the phase difference between $V_{drive}$ and $V_{c1}$ may be derived.

It is noted that in some implementations, the drive frequency value, $f_{drive}$, and the resonant frequency value, $f_{res}$, may be determined and compared directly. However, one advantage of monitoring the phase shift from 90° is the direction of the shift from 90° provides an indication of the direction of the shift in the resonant frequency. In a series resonant circuit, when the resonant frequency, $f_{res}$, has shifted down from the drive frequency, $f_{drive}$, the phase difference between $V_{drive}$ and $V_{out}$ is less than 90°. If the resonant frequency, $f_{res}$, has shifted up from the drive frequency, $f_{drive}$, the phase difference between $V_{drive}$ and $V_{out}$ is greater than 90°. The phase shift from 90° provides information regarding the direction in which the resonant frequency, $f_{res}$, needs to be shifted to again match the drive frequency, $f_{drive}$.

In example implementations, the phase difference from 90° may be determined by connecting the RF amplifier output, $V_{drive}$, and the resonator output, $V_{out}$, to ADCs (with appropriate voltage scaling) connected to a controller, such as the resonance tuning controller 250, which may be implemented using an FPGA. The FPGA may be programmed to digitally analyze the waveforms to measure the phase difference between $V_{drive}$ and $V_{out}$. Alternatively, the resonance tuning controller 250 may be configured to use a controller clock and zero crossing detectors at the input receiving $V_{drive}$ and $V_{out}$. The voltages at $V_{drive}$ and $V_{out}$ may be scaled down before connecting the signals to the inputs of the resonance tuning controller 250.

Figure 2B:
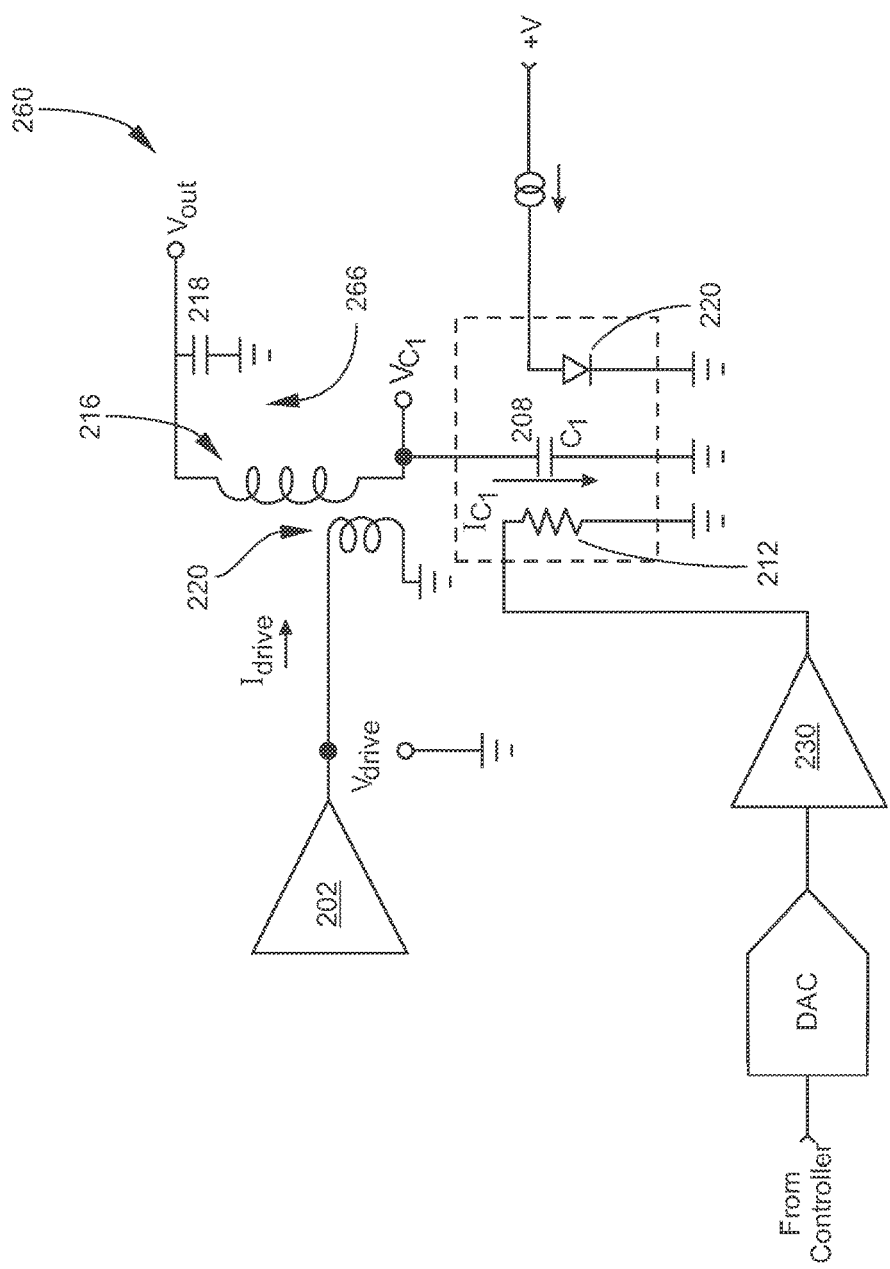
FIG. 2B is a schematic diagram of an example implementation of the system in FIG. 1 using a parallel resonant circuit.

FIG. 2B illustrates a system 260 having substantially the same function and purpose as the system 200 in FIG. 2A except the system 260 in FIG. 2B uses a parallel resonant circuit 266 instead of the series resonant circuit 206 used in the system 200 in FIG. 2A. The parallel resonant circuit 266 in FIG. 2B includes a resonator inductor 216 provided as a secondary winding of a transformer having a primary winding 220, a capacitive element 218, and a tuning capacitor 208. The transformer is configured to provide an optimum impedance match between the RF amplifier 202 and the parallel resonant circuit 266 to provide maximum power transfer at resonance.

In the system 260 in FIG. 2B, the phases to be compared are those of the RF drive voltage, $V_{drive}$, and the RF drive current, $I_{drive}$. In LC resonant circuits in general the phase of the RF voltage driving the resonator will be the same as the phase of the RF current drawn by the resonator when the frequency of the drive voltage is equal to the resonance frequency of the circuit. When the phase of $V_{drive}$ is equal to the phase of $I_{drive}$, the resonant frequency, $f_{res}$, is equal to the drive frequency, $f_{drive}$.

Figure 3A:
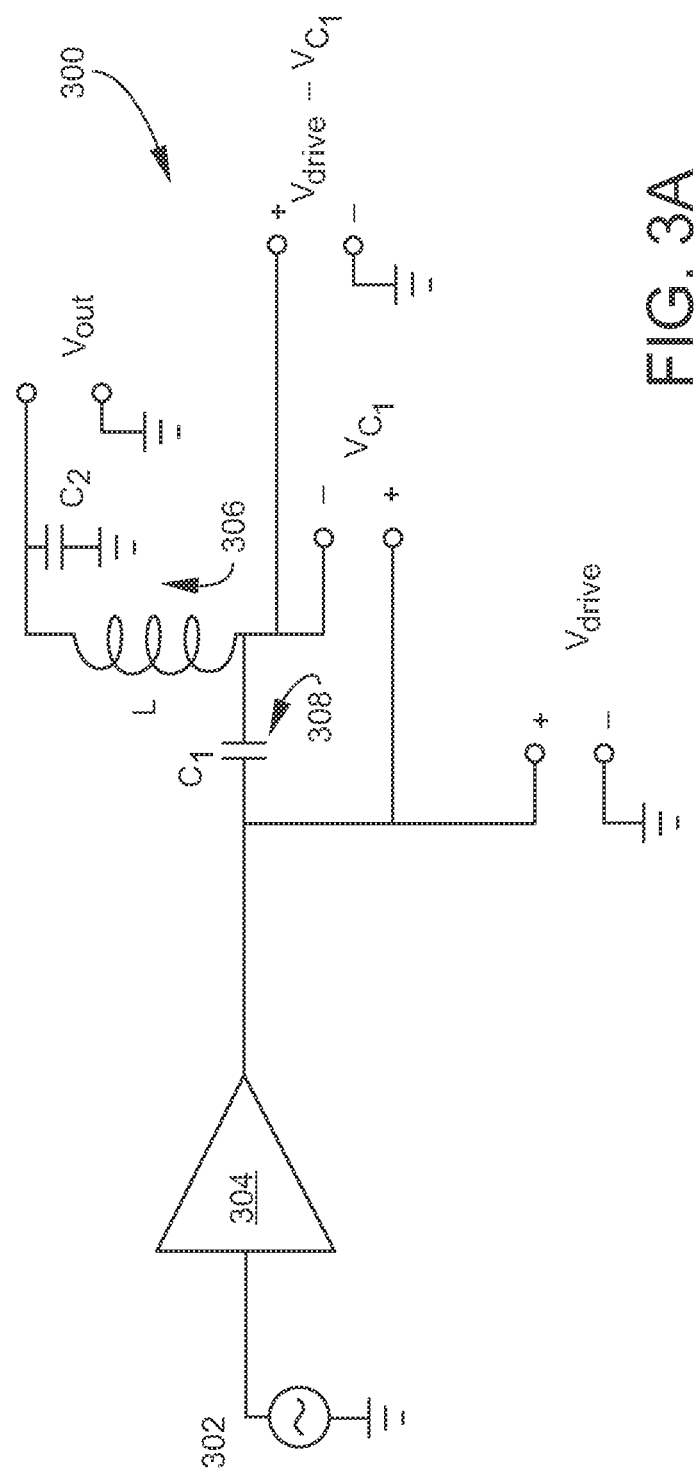
FIG. 3A is a schematic diagram of an RF amplifier and series resonant circuit illustrating techniques for detecting when the drive signal frequency and the resonant-circuit frequency have different values.

FIG. 3A is a schematic diagram of a system 300 that includes an RF amplifier 304 and a series resonator 306. FIG. 3A illustrates alternative techniques for detecting a difference between the drive frequency at the output of the RF amplifier and the resonant frequency of the resonator 306. The system 300 includes a tuning capacitor 308 and an oscillator 302 to feed a drive signal to the RF amplifier 304. The tuning capacitor 308 may be replaced by a tuning inductor that changes inductance when subject to a change in temperature. The RF amplifier 304 generates an amplified drive signal at the tuning capacitor 308. FIG. 3A shows 1) voltage signal, $V_{out}$, which is the output voltage across capacitor $C_2$ in the resonator 306, 2) voltage signal, $V_{C1}$, the voltage across the tuning capacitor 308, and 3) voltage signal $V_{drive}$, which is the voltage at the output of the RF amplifier 304 to ground. Voltage signals $V_{out}$, $V_{drive}$, and $V_{C1}$ may be monitored to detect the phase differences. The resonance tuning controller 110 (in FIG. 1) may perform $(V_{drive})-(V_{drive}-V_{C1})=V_{C1}$. The phase at $V_{C1}$ may then be compared with the phase of $V_{drive}$ to determine if the resonant frequency and the drive frequency are different.

Figure 3B:
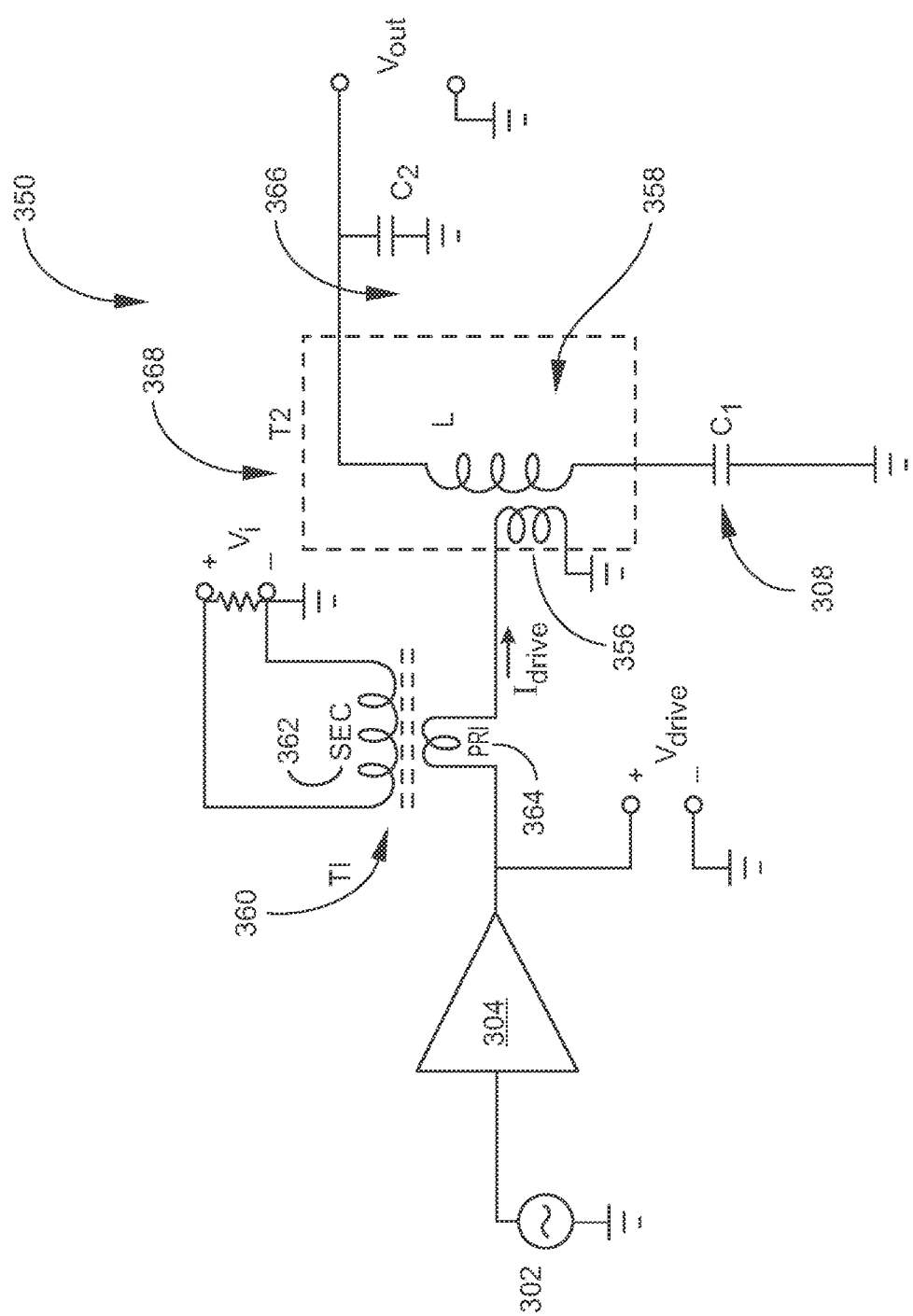
FIG. 3B is a schematic diagram of an RF amplifier and parallel resonant circuit illustrating techniques for detecting when the drive signal frequency and the resonant-circuit frequency have different values.

FIG. 3B is a schematic diagram of a system 350 detecting when the drive frequency signal and the resonant frequency have different frequency values. The system 350 in FIG. 3B is similar in function and operation to the system 300 shown in FIG. 3A except the system 350 in FIG. 3B includes a parallel resonant circuit 366 instead of the series resonant circuit 306 in the system 300 in FIG. 3A. The system 350 also includes a current transformer (T1) 360 to provide a voltage signal, $V_i$, used as described below in detecting when the drive frequency value, $f_{drive}$, and the resonant frequency value, $f_{res}$, are different.

The parallel resonant circuit 366 in FIG. 3B includes a transformer (T2) 368, which includes a primary winding 356 configured to receive a current, $I_{drive}$, from a RF amplifier 304, and a secondary winding 358. The transformer (T2) 368 may be configured to provide an optimum impedance match between the RF amplifier 304 and the parallel resonant circuit 366 to provide maximum power transfer at resonance. The secondary winding 358 is connected to a tuning capacitor ($C_1$) 308 at one end. The tuning capacitor 308 is connected to ground at the opposite end to form the parallel resonance circuit 366. The parallel LC resonant circuit 366 also includes an output capacitor ($C_2$), which may be a capacitance in the load at $V_{out}$.

The current transformer (T1) 360 is formed with a primary winding 364 and a secondary winding 362. The primary winding 364 is in series with the output of the RF amplifier 304 and the primary winding 356 of the transformer (T2) 368 of the LC parallel resonator circuit 366. The secondary winding 362 provides a voltage signal, $V_i$, which is in phase with the drive current, $I_{drive}$. In an example implementation, a controller may sample the voltage signal, $V_i$, and the voltage signal, $V_{drive}$, to detect when the phase difference between the two signals is 0 degrees, which would indicate that the drive frequency, $f_{drive}$, is not different from the resonator frequency, $f_{res}$.

Figure 4A:
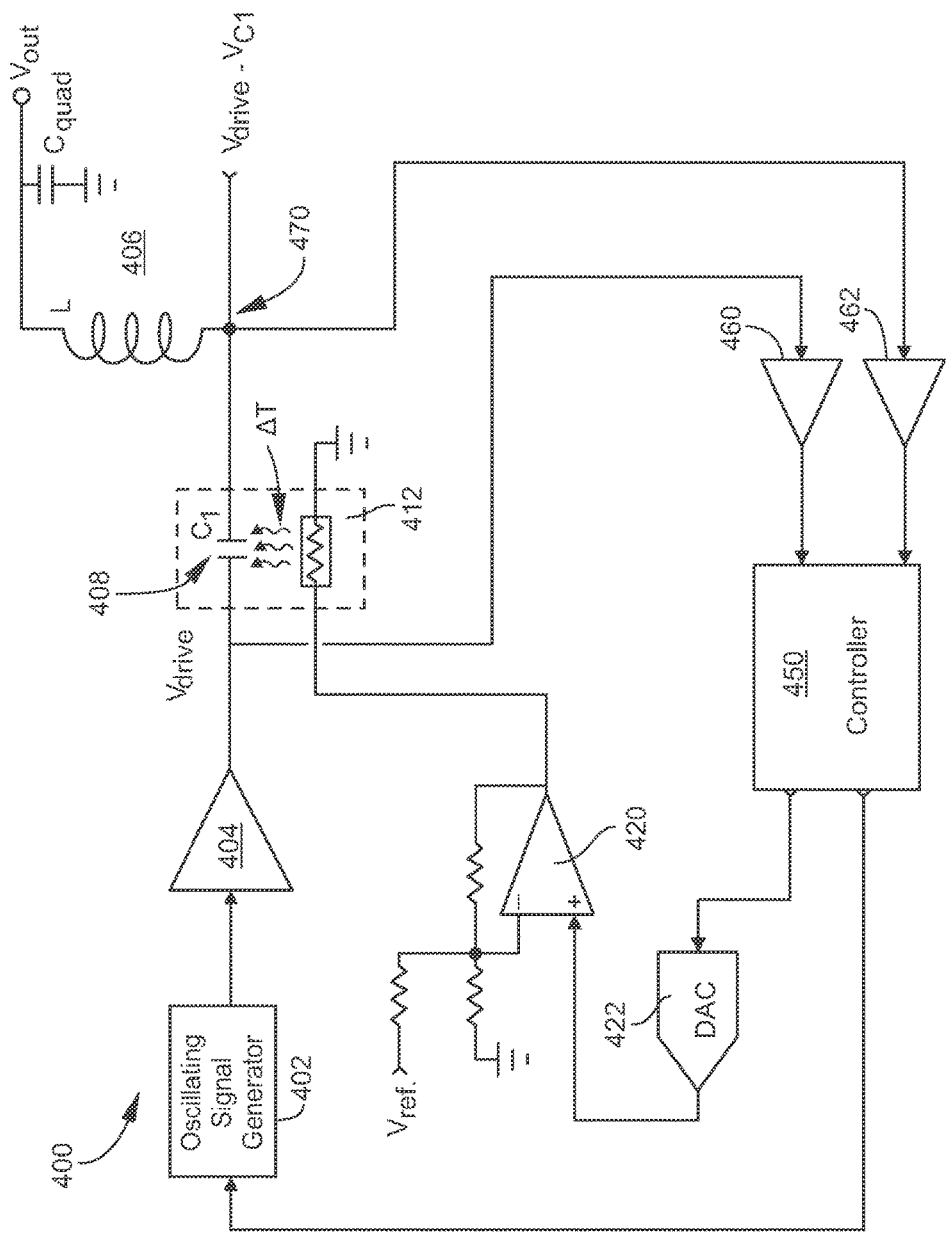
FIG. 4A is a schematic diagram of an example implementation of the system in FIG. 2A.

The schematic diagram in FIG. 4A shows a high-voltage RF signal generating system 400 that includes an oscillating signal source 402, a RF amplifier 404, and an LC resonator 406 having a tuning capacitor ($C_1$) 408, a second capacitor, $C_{quad}$, in series with the tuning capacitor 408, and an inductor L. The system 400 in FIG. 4A is an example of a high voltage RF signal source that may be implemented as a resonator for a quadrupole assembly in a mass spectrometer. The second capacitor, $C_{quad}$, in the LC resonator 406 is the capacitance of the quadrupole rods across which the RF output signal at $V_{out}$ is generated.

The system 400 in FIG. 4A also includes a temperature changing element 412 positioned to radiate heat H so as to affect the temperature at the tuning capacitor 408. The temperature changing element 412 is controlled by a temperature control signal generated by a tuning amplifier 420, which amplifies a DC signal received from a tuning DAC 422. The tuning DAC 422 receives a digital signal from a resonance tuning controller 450. The digital signal may provide a number corresponding to the level of the DC signal. The level of the DC signal may be controlled to control the amount of heat radiated toward the tuning capacitor 408.

The system 400 in FIG. 4A also includes a first driver 460 and a second driver 462 connected to inputs of the resonance tuning controller 450. The first driver 460 may receive a voltage signal $V_{drive}$ from a connection to the RF amplifier output. The second driver 462 may receive a voltage signal $V_{drive}-V_{C1}$ from a connection to a resonator signal node 470. The first driver 460 and the second driver 462 may be implemented using comparators configured to clip and scale the voltage input so the resonance tuning controller 450 receives voltage levels that are appropriate to its requirements.

The operation of the system 400 in FIG. 4A involves a drive signal output from the oscillating signal source 402, which is controlled by the resonance tuning controller 450. The oscillating signal controller 402 may be a DAC or a direct digital synthesizer (DDS) or a phase-locked-loop (PPL) synthesizer or a voltage controlled oscillator (VCO). The oscillating signal source 402 may be configured to receive an instruction requesting it generate an oscillating signal at a frequency and amplitude. In response, the oscillating signal source 402 generates the oscillating signal at the indicated frequency and amplitude.

The analog signal is amplified by the RF amplifier 404 to generate the amplified drive signal received by the LC resonator 406, which includes the tuning capacitor 408, inductor L, and the quad capacitance. As described above, the tuning capacitor 408 is a thermally-tuned capacitor with a capacitance $C_1$ that varies with temperature.

The resonance tuning controller 450 in the system 400 is configured to detect the difference between the resonant frequency, $f_{res}$, and the drive frequency, $f_{drive}$, by monitoring the phase difference between the drive voltage $V_{drive}$ at the resonator input and the voltage $V_{out}$ at the resonator output. The phase of $V_{out}$ is the same as the phase of the voltage across $C_1$ since $C_1$ is in series with the quad capacitance and the latter is across the resonator output. As noted above, the difference between the phase of $V_{C1}$ and the phase of $V_{drive}$ is 90° when the resonator is tuned to $f_{drive}$. The resonance tuning controller 450 determines $V_{C1}$ by calculating $(V_{drive})-(V_{drive}-V_{C1})=V_{C1}$. The phase at $V_{C1}$ may then be compared with the phase of $V_{drive}$ to determine if the resonant frequency and the drive frequency are different.

The resonance tuning controller 450 may receive the drive signal, $V_{drive}$, from a first voltage scaler, which may be the first driver 460 in FIG. 4A, connected between the RF amplifier output, $V_{drive}$, and a first resonance tuning controller input. The resonance tuning controller 450 may receive the resonator output, $V_{drive}-V_{C1}$ at node 470, from a second voltage scaler, which may be the second driver 462, connected between the resonator output at node 470 and a second resonance tuning controller input. The resonance tuning controller 450 may include a controller clock to generate clock signals, and a zero-crossing detector to detect the timing relationships between the clock zero crossings and the zero crossings of the two controller input signals, from which the phase relationship between the two input signals may be determined, which in turn will yield the phase relationship between the RF amplifier output $V_{drive}$ and the resonator output $V_{out}$.

It is noted that the techniques described herein for determining when the drive frequency and the resonant frequency have different frequency values are not intended as limiting the implementations to any specific techniques. Any suitable technique for determining when two frequencies are different may be used as well.

The resonance tuning controller 450 may include a first analog-to-digital converter (ADC) connected between the RF amplifier output, $V_{drive}$, and a first resonance tuning controller input. The first driver 460 may be used to scale the voltage for the first ADC. A second ADC may be connected between the resonator node, $V_{drive}-V_{C1}$, and a second resonance tuning controller input. In an implementation in which the first and second ADCs are inserted, the second driver 462 may be configured to have a differential input (or be preceded by a differential amplifier) to look across the tuning capacitor 408 (C1) such that the output of the second driver 462 feeds the input to the resonance tuning controller 450 the voltage $V_{C1}$. The resonance tuning controller 450 compares a first plurality of digital values received from the first ADC with a second plurality of digital values received from the second ADC. The resonance tuning controller 450 then determines the phase between the RF amplifier output and the resonator output. The determination of the phase may be performed using digital waveform analysis to determine the time between each signal.

The resonance tuning controller 450 in the system 400 may determine that the difference between the phase of $V_{C1}$ and the phase of $V_{drive}$ is 90°, which indicates the drive frequency and the resonant frequency are the same. In an example implementation, the tuning capacitor 408 may be selected to have a capacitance about midway through the range of capacitances over the operating temperature range. The tuning capacitor 408 may also be selected such that the tuning capacitor 408 would require some heating at about midway in the operating temperature range of the system 400. The resonance tuning controller 450 may generate a digital signal corresponding to a voltage level that would generate heat at the temperature changing element 412 sufficient to maintain the temperature of the tuning capacitor 408 at about the midway point of the operating temperature range.

The resonance tuning controller 450 may determine the difference between the phase of $V_{C1}$ and the phase of $V_{drive}$ is greater than 90°, which indicates the resonant frequency has drifted to a value less than the drive frequency. The resonance tuning controller 450 may respond by generating the digital signal output to the tuning DAC 422 with a value that would increase the heat from the temperature changing element 412. The increased heat creates a capacitance decrease in the tuning capacitor 408, which causes the resonance frequency of the resonator to increase.

The resonance tuning controller 450 may determine if the difference between the phase of $V_{C1}$ and the phase of $V_{drive}$ is less than 90°, which indicates the resonant frequency has drifted to a value greater than the drive frequency. The resonance tuning controller 450 may respond by generating the digital signal output to the tuning DAC 422 with a value that would decrease the heat from the temperature changing element 412. The decreased heat creates a capacitance increase in the tuning capacitor 408, which causes the resonance frequency of the resonator to decrease. It is noted that in an implementation of the system 400 in FIG. 4A in which the high voltage RF signal output, $V_{out}$, drives a quadrupole assembly, another complementary system 400 is implemented to generate a high voltage RF signal output, $-V_{out}$, that is 180° out of phase with $V_{out}$. The two systems then combine to generate a high amplitude RF signal across $V_{out}$ and $-V_{out}$. An alternative implementation of a system 480 for generating a high voltage RF signal to drive a quadrupole assembly in a mass spectrometer is shown in FIG. 4B.

Figure 4B:
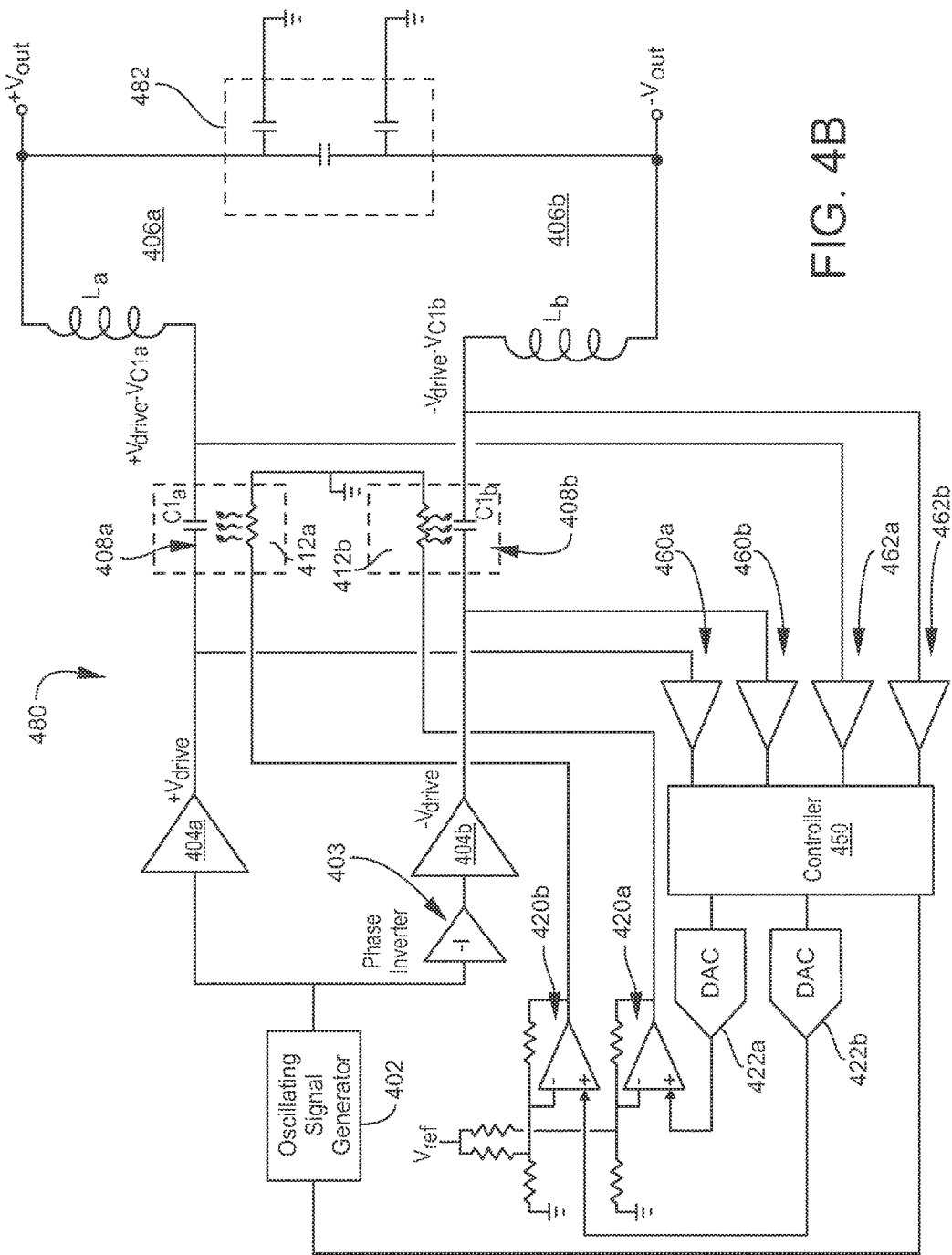
FIGS. 4B and 4C are schematic diagrams of an example implementation of the system in FIG. 4A with differential balanced RF outputs.

FIG. 4B is a schematic diagram of a system 480 comprising an oscillating signal generator 402 configured to generate a drive frequency signal having a drive frequency value, $f_{drive}$, a differential amplifier 404 having a first amplifier 404a and a second amplifier 404b, and a series resonating circuit 406 configured to receive the differential outputs of the differential amplifier 404 across $+V_{drive}$ and $-V_{drive}$ and to generate a high voltage RF resonating signal across $+V_{out}$ and $-V_{out}$. The first amplifier 404a of the differential amplifier 404 receives the drive frequency signal directly from the oscillating signal generator 402. The second amplifier 404b of the differential amplifier 404 receives the drive frequency signal from a phase inverter 403, which ensures the drive frequency input to the second amplifier 404b is shifted in phase by 180°. The phase inverter 403 causes the inversion in the signal input to the second amplifier 404b to generate the amplified RF signal as a $-V_{drive}$ signal relative to the $+V_{drive}$ signal.

The series resonating circuit 406 includes a first stage 406a and a second stage 406b. The first stage 406a of the series resonating circuit 406 includes an inductor $L_a$, a tuning capacitor (C1$_a$) 408a, and a quad capacitance 482, which is the capacitance across $+V_{out}$. The second stage 406b of the series resonating circuit 406 includes an inductor $L_b$, a tuning capacitor (C1$_b$) 408b, and a quad capacitance 482, which is the capacitance across $-V_{out}$. The tuning capacitors 408a and 408b may each be tuned by adjustment of the temperature of each tuning capacitor 408a, 408b using a corresponding temperature changing element 412a, 412b. The temperature changing elements 412a, 412b may be configured as described above with reference to FIG. 1 to heat or cool the tuning capacitors 408a, 408b in accordance with the change in frequency value between the drive frequency, $f_{drive}$, and the resonant frequency, $f_{res}$.

The system 480 includes a controller 450 configured to receive differential amplifier output signals at $+V_{drive}$ and $-V_{drive}$ from the differential amplifier 404. The controller 450 receives the differential amplifier output signals at $+V_{drive}$ and $-V_{drive}$ via a first driver 460a connected to the differential amplifier output signal $+V_{drive}$, and a second driver 460b connected to the differential amplifier output signal $-V_{drive}$. The controller 450 may also receive voltage signal $+V_{drive}-V_{C1a}$, which is the voltage signal at the node between the tuning capacitor (C1$_a$) 408a and the inductor $L_a$ where $V_{C1a}$ is the voltage across the tuning capacitor (C1$_a$) 408a. The controller 450 may receive voltage signal $-V_{drive}-V_{C1b}$, which is the voltage signal at the between the tuning capacitor (C1$_b$) 408$b$ and the inductor L$_b$ where V$_{C1b}$ is the voltage across the tuning capacitor (C1$_b$) 408$b$. The controller 450 in FIG. 4B receives the voltage signal +V$_{drive}$–V$_{C1a}$ via a third driver 462$a$, and the voltage signal –V$_{drive}$–V$_{C1b}$ via a fourth driver 462$b$. The controller 450 compares the phase of the voltage signal +V$_{drive}$ with the phase of the voltage signal +V$_{drive}$–V$_{C1a}$ to determine if the frequency of V$_{drive}$ is different from the resonant frequency value of the series resonant circuit formed by C1$a$, 406$a$, and the capacitive load 482. The controller 450 compares the phase of the voltage signal –V$_{drive}$ with the phase of the voltage signal –V$_{drive}$–V$_{C1b}$ to determine if the frequency of V$_{drive}$ is different from the resonant frequency value of the series resonant circuit formed by C1$b$, 406$b$, and the capacitive load 482.

Depending on the result of the comparison of the phase between +V$_{drive}$ (or –V$_{drive}$) and +V$_{drive}$–V$_{C1a}$ (or –V$_{drive}$–V$_{C1b}$), the controller 450 generates a digital signal indicating whether the corresponding temperature changing element 412$a$, 412$b$ should heat or cool the corresponding tuning capacitor 408$a$, 408$b$. The digital signal based on the comparison between +V$_{drive}$ and +V$_{drive}$–V$_{C1a}$ is received at a DAC 422$a$, which generates an analog signal corresponding to the digital signal, which may be amplified by a first tuning amplifier 420$a$. The digital signal based on the comparison between –V$_{drive}$ and –V$_{drive}$–V$_{C1a}$ is received at a DAC 422$b$, which generates an analog signal corresponding to the digital signal, which may be amplified by a second tuning amplifier 420$b$.

In an alternative implementation, the two DACs 422$a$ and 422$b$, and the two tuning amplifiers 420$a$ and 420$b$, may be replaced with a single DAC and a single tuning amplifier that drives both temperature changing elements 412$a$ and 412$b$. The resonance determination in such an implementation would typically be based upon averaged values of the phase deltas associated with the two differential drives.

Figure 4C:
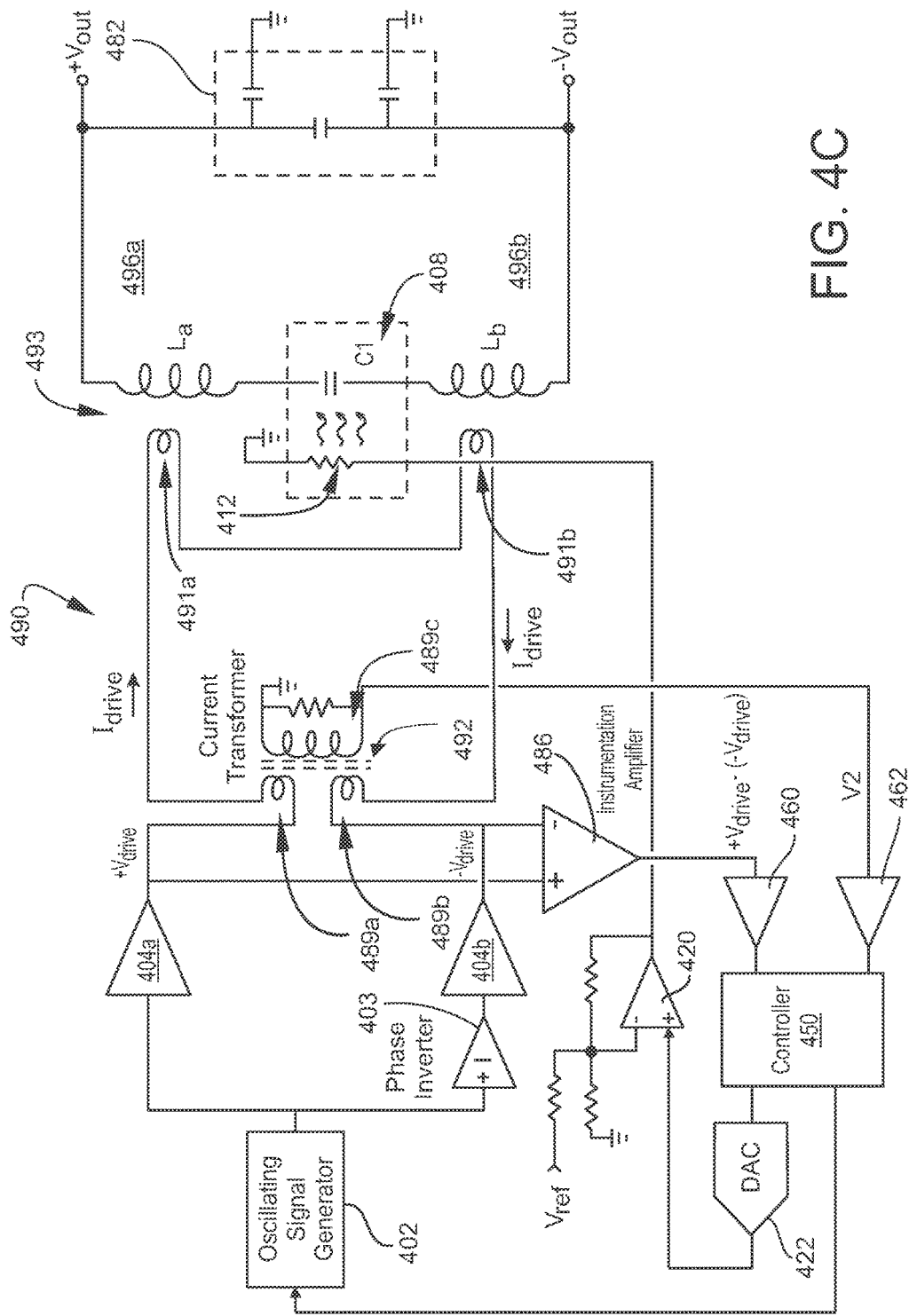

FIG. 4C is a schematic diagram of another system 490 for generating a high voltage RF signal to drive a quadrupole assembly in a mass spectrometer. The system 490 includes a parallel resonator circuit 496 including a first stage 496$a$ and a second stage 496$b$.

The parallel resonator circuit 496 includes a single tuning capacitor (C1) 408 configured as a component of both the first stage 496$a$ and the second stage 496$b$. The first stage 496$a$ includes the tuning capacitor (C1) 408 in series with a first secondary winding L$_a$ of a transformer 493 and the quad capacitance 482, which represents the capacitance encountered by the first stage 496$a$ of the parallel resonator 496 at +V$_{out}$. The second stage 496$b$ includes the tuning capacitor (C1) 408 in series with a second secondary winding L$_b$ of the transformer 493 and the quad capacitance 482, which represents the capacitance encountered by the second stage 496$b$ of the parallel resonator 496 at –V$_{out}$.

The transformer 493 includes a first resonator primary winding 491$a$ corresponding to the first secondary winding L$_a$, and a second resonator primary winding 491$b$ corresponding to the second secondary winding L$_b$. The first secondary winding L$_a$ is in series with the tuning capacitor (C1) 408 and the second secondary winding L$_b$. The first resonator primary winding 491$a$ is in series with the second resonator primary winding 491$b$. The transformer 493 is configured to provide an optimum impedance match between the differential RF amplifier 404 and the parallel resonant circuit 496 to provide maximum power transfer at resonance.

The system 490 also includes a current transformer 492 having a first primary winding 489$a$ in series with the first resonator primary winding 491$a$ of the transformer 493 and in series with the output of the first amplifier 404$a$ generating the voltage signal +V$_{drive}$. The current transformer 492 includes a second primary winding 489$b$ in series with the second resonator primary winding 491$b$ of the transformer 493 and in series with the output of the second amplifier 404$b$ generating the voltage signal –V$_{drive}$. The current transformer 492 includes a secondary winding 489$c$, which provides a voltage signal, V$_i$, corresponding to a drive current, I$_{drive}$. The two amplifier outputs, +V$_{drive}$ and –V$_{drive}$, are connected in series through the two current transformer primary windings 489$a$ and 489$b$ and through the two resonator primary windings 491$a$ and 491$b$, without reference to ground. The total balanced drive voltage is therefore +V$_{drive}$–(–V$_{drive}$). The output of the first amplifier 404$a$, +V$_{drive}$, connects to the positive input of an instrumentation amplifier 486. The output of the second amplifier 404$b$, –V$_{drive}$, connects to the negative input of the instrumentation amplifier 486. The instrumentation amplifier 486 re-references the total voltage +V$_{drive}$ and –V$_{drive}$ with respect to ground, which then drives a first driver stage 460.

The output of the first driver stage 460 carries the scaled drive voltage output of the instrumentation amplifier 486, which is at the same phase as the drive voltage signal across the outputs of the differential amplifier 404. The secondary winding of the current transformer 492 carries a voltage that is the same phase as the drive current, I$_{drive}$, which is also in phase with the signal V$_i$ at a second driver stage 462. The controller 450 compares the phase of the signal, +V$_{drive}$–(–V$_{drive}$), received from the first driver stage 460 with the phase of the signal, V$_i$, received from the second driver stage 460. As noted above, the resonator frequency matches the drive frequency when the phase of the drive current, I$_{drive}$, differs by 90° from the phase of the drive voltage, +V$_{drive}$–(–V$_{drive}$).

Figure 4D:
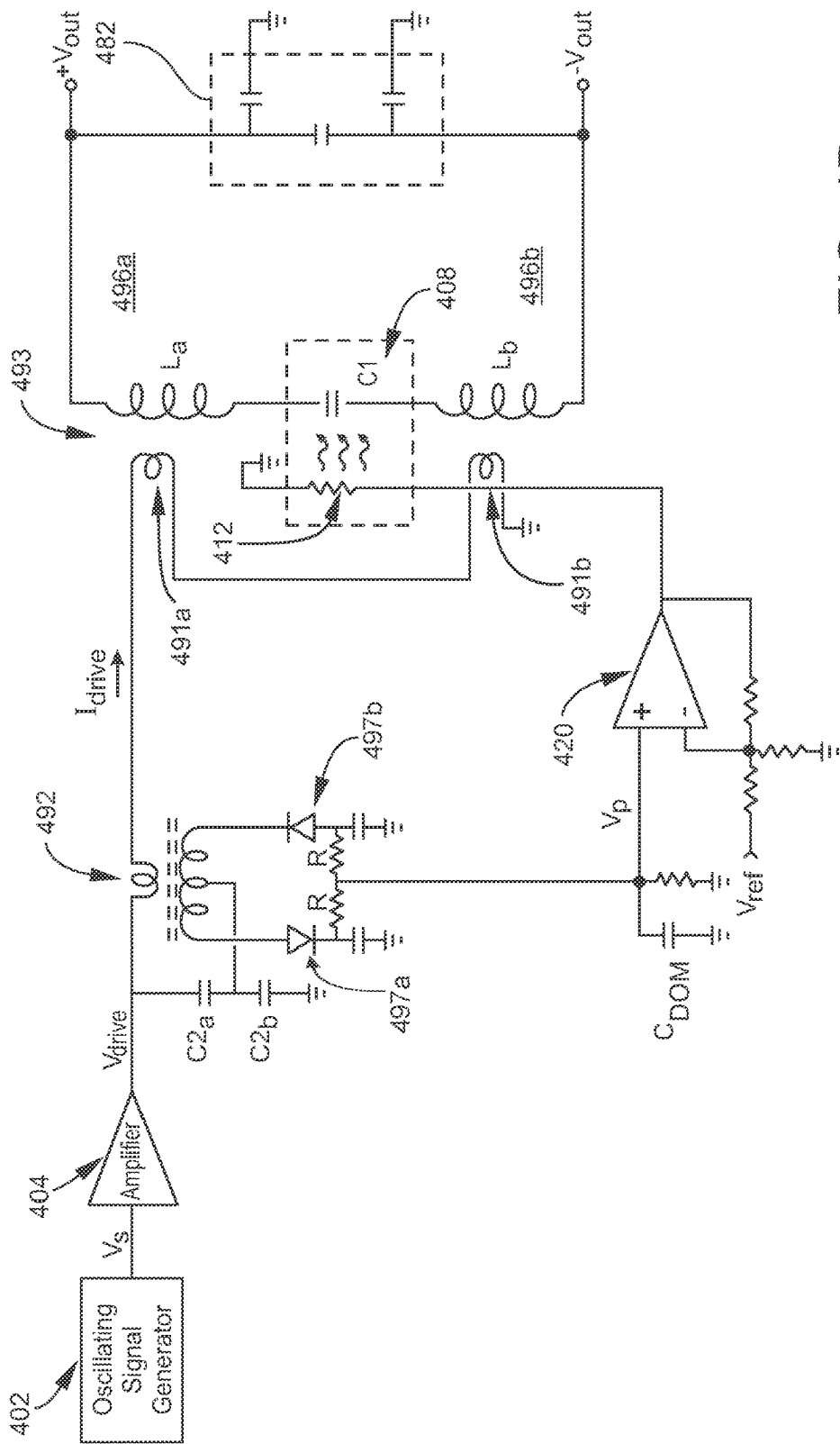
FIG. 4D is a schematic diagram of an example implementation of a system having differential balanced RF outputs driven by a single RF amplifier.

It is noted that a parallel-resonance balanced output topology utilizing a parallel resonator as illustrated by the parallel resonator circuit 496 in FIG. 4C does not strictly require implementation of a differential drive amplifier. FIG. 4D illustrates an example implementation using a single drive amplifier 404 and a 2-winding current transformer 492 such as the current transformer illustrated in FIG. 3B. The primary winding of the current transformer 492 in FIG. 4D is in series with the output of the RF amplifier 404, V$_{drive}$ on one side, and with a first resonator primary winding 491$a$ and a second resonator primary winding 491$b$ on the other side so that output current, I$_{drive}$, drives the first resonator primary winding 491$a$ and the second resonator primary winding 491$b$ with the bottom connection of the second resonator primary winding 491$b$ grounded (the first resonator primary winding 491$a$ and the second resonator primary winding 491$b$ still being connected in series).

Referring to FIGS. 4A-C, the illustrated control loops utilize a digital controller 450. However, in other implementations, a fully analog control loop could be employed. Analog control loops for auto-tuning radio transmitters to resonance (typically using motor controlled tuning of mechanical variable capacitors) are common and known to those versed in the art. FIG. 4D illustrates one way in which an analog control loop may be used in place of a digital controller based approach. Capacitors C2$_a$ and C2$_b$ are connected to convey a specific fraction of V$_{drive}$ to a center-tap on a secondary winding of the current transformer 492. The two balanced current transformer outputs from the secondary winding of the current transformer 492 drive two detector diodes 497$a$ and 497$b$, the DC outputs of which are summed. When the ratio C2$_a$/C2$_b$ is correctly chosen with respect to the turns ratio of the current transformer 492, a phase discrimination voltage, $V_p$, will ideally be equal to zero when the phase of $V_{drive}$ is equal to the phase of $I_{drive}$. When the frequency of $V_{drive}$ is greater than the resonance frequency, the phase of $V_{drive}$ leads the phase of $I_{drive}$ and the polarity of $V_p$ will be positive. When the drive frequency is less than the resonance frequency the polarity of $V_p$ will be negative. This voltage drives the tuning amplifier 420. Capacitor $C_{DOM}$ sets the dominant network pole for the control loop to ensure loop stability.

Figure 5A:
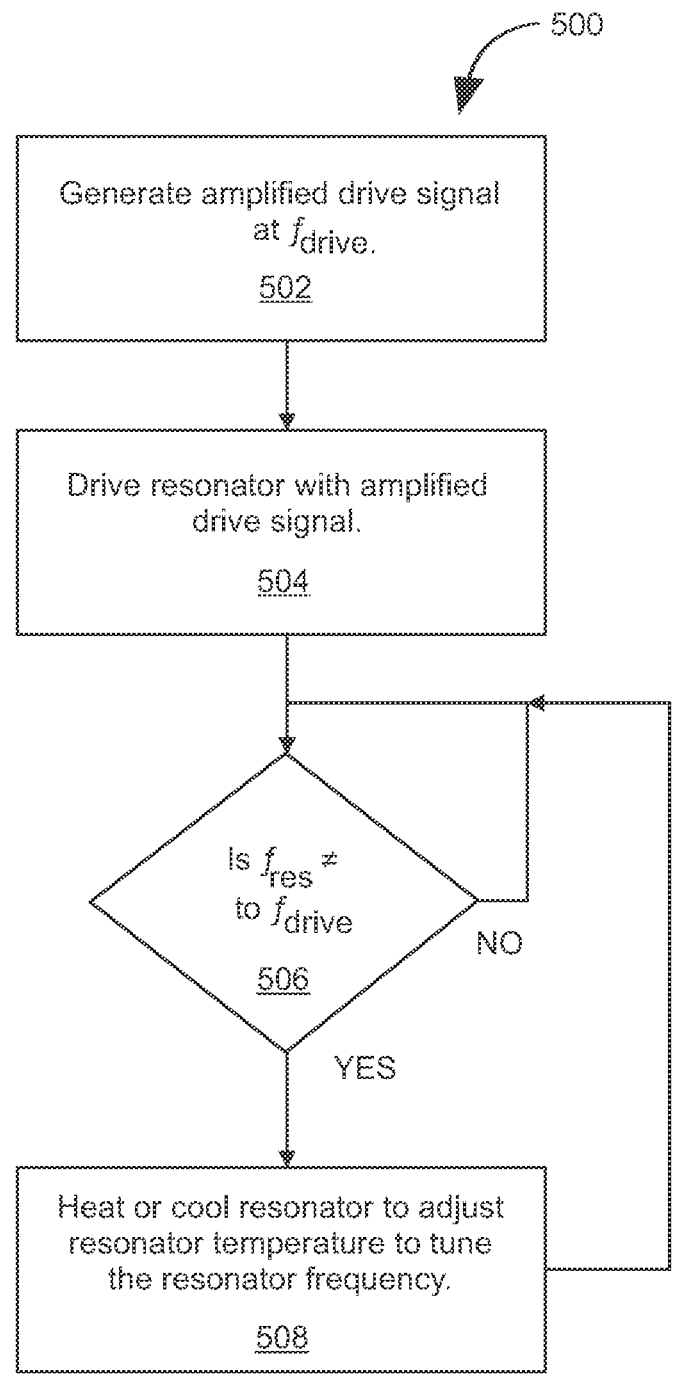
FIG. 5A is a flowchart illustrating operation of a method for providing a RF output signal at a high voltage.

FIG. 5A is a flowchart 500 illustrating operation of a method for providing a RF output signal at a high voltage. The method illustrated by the flowchart 500 in FIG. 5A shall be understood to operate in example implementations of the system 100 in FIG. 1 unless otherwise stated in the description below. At step 502 of the method, the RF amplifier 104 generates an amplified RF signal having a frequency of $f_{drive}$. At step 504, the resonator 106 is driven by the amplified drive RF signal to produce the high voltage RF output $V_{out}$. Decision block 506 determines if the drive frequency, $f_{drive}$, and the resonant frequency, $f_{res}$, are different. If the drive frequency is not the same as the resonant frequency, the heat radiated to the tuning component 108 in the resonator 106 is adjusted at step 508 to tune the resonator frequency back to the same value as the drive frequency. The heat radiated to the tuning component 108 may be adjusted by heating or by cooling the tuning component 108. The resonance tuning controller 110 may determine if the resonator frequency has decreased or increased from the drive frequency. The resonator 106 is tuned by increasing or decreasing the heat radiated to the tuning component 108 (even turning the temperature changing element 112 off if necessary). Steps 502-508 are repeated as long as the system is required to generate the RF output signal at the high voltage.

Figure 5B:
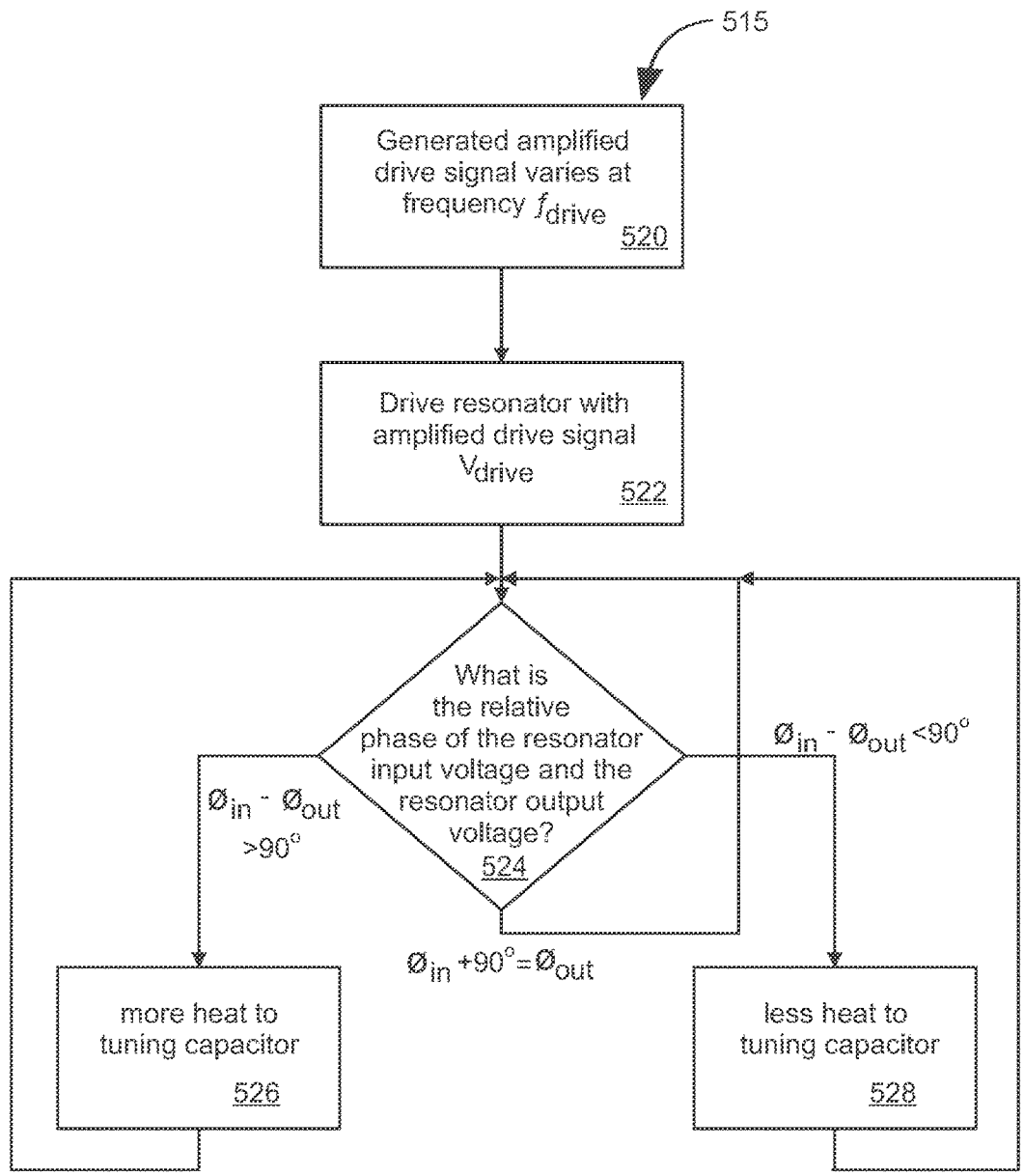
FIG. 5B is an example implementation of the method illustrated in the flowchart in FIG. 5A illustrating operation of an example method for detecting differences between the drive frequency and the resonant frequency.

FIG. 5B is a flowchart 515 illustrating operation of a method for generating a high voltage RF signal at a desired resonant frequency similar to the method illustrated in FIG. 5A where the flowchart in FIG. 5B includes steps relating to an example for determining when a drive frequency value and a resonant frequency value are different in a series resonant system. At step 520 of the method, the RF amplifier generates an amplified RF signal having a frequency of $f_{drive}$. At step 522, the resonator is driven by the amplified drive RF signal to generate the resonator output voltage. At decision block 524, the system determines the relative phase difference between the resonator input voltage ($V_{drive}$ in FIG. 4A, for example) and the resonator output voltage ($V_{out}$ in FIG. 4A). This is accomplished by monitoring the phase of $V_{drive}$ and the phase of ($V_{drive}-V_{C1}$) with a controller (450 in FIG. 4A). From this the controller can derive the phase of $V_{C1}$ and then compare that to the phase of $V_{drive}$. This is equivalent to comparing the phases of $V_{out}$ and $V_{drive}$ since the phase of $V_{C1}$ is the same as the phase of $V_{out}$ (because C1 and $C_{quad}$ are in series with each other, such as shown in FIG. 4A). If the phase difference is greater than 90°, more heat is applied (or less cooling is applied) to the tuning component (such as tuning capacitor $C_1$ in FIG. 4A) at step 526. If the phase difference is less than 90°, less heat is applied to the tuning component (such as tuning capacitor $C_1$ in FIG. 4A) at step 528.

Figure 6:
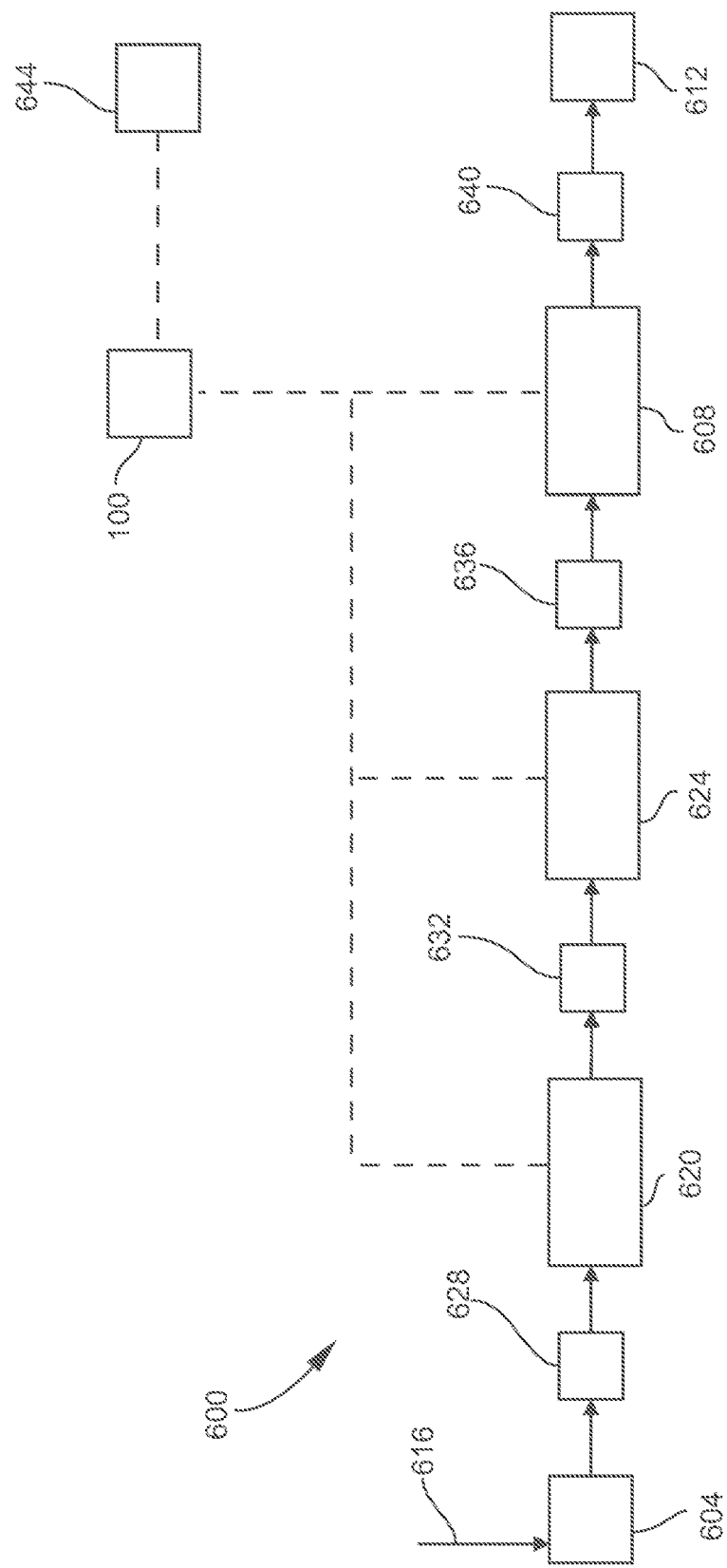
FIG. 6 is a schematic view of an example of a mass spectrometer (MS) or mass spectrometry (MS) system according to some embodiments.

FIG. 6 is a schematic view of an example of a mass spectrometer (MS) or mass spectrometry (MS) system 600 according to some embodiments, which may be utilized in the implementation of the subject matter described herein. The operation and design of various components of MS systems are generally known to persons skilled in the art and thus need not be described in detail herein. Instead, certain components are briefly described to facilitate an understanding of the subject matter presently disclosed.

According to some embodiments, the MS system 600 includes at least one electrode assembly, such as a multipole electrode assembly typically utilized as an ion guide. Depending on the embodiment, the multipole electrode assembly may be configured to perform additional functions related to ion processing, such as mass filtering, mass selection, ion trapping, ion beam cooling, ion beam focusing, ion beam shaping, ion fragmentation, etc., as appreciated by persons skilled in the art. The multipole electrode assembly is an example of a load that may be driven by a system for generating a high-voltage RF output signal as described herein, such as the high-voltage RF signal generating system 100 illustrated in FIG. 1. Thus, in an embodiment of the present disclosure, an electrode assembly may include a system for generating a radio frequency (RF) output signal at high voltage as described herein, and a plurality of electrodes, wherein one or more of the electrodes communicate with the system and are configured to receive the RF output signal.

Figure 7A:
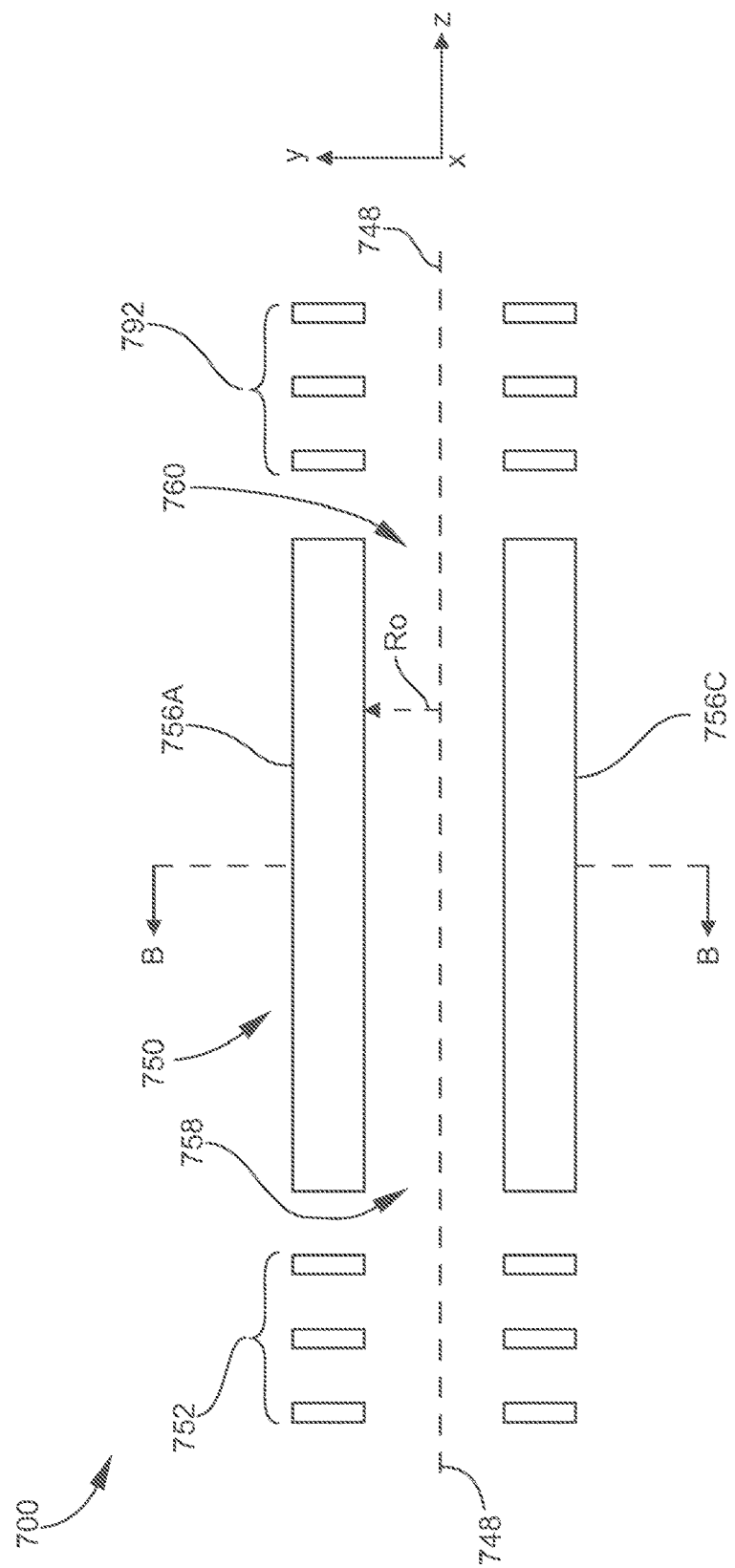
FIG. 7A is a schematic side (lengthwise) view of an example of a quadrupole ion guide assembly according to some embodiments.
Figure 7B:
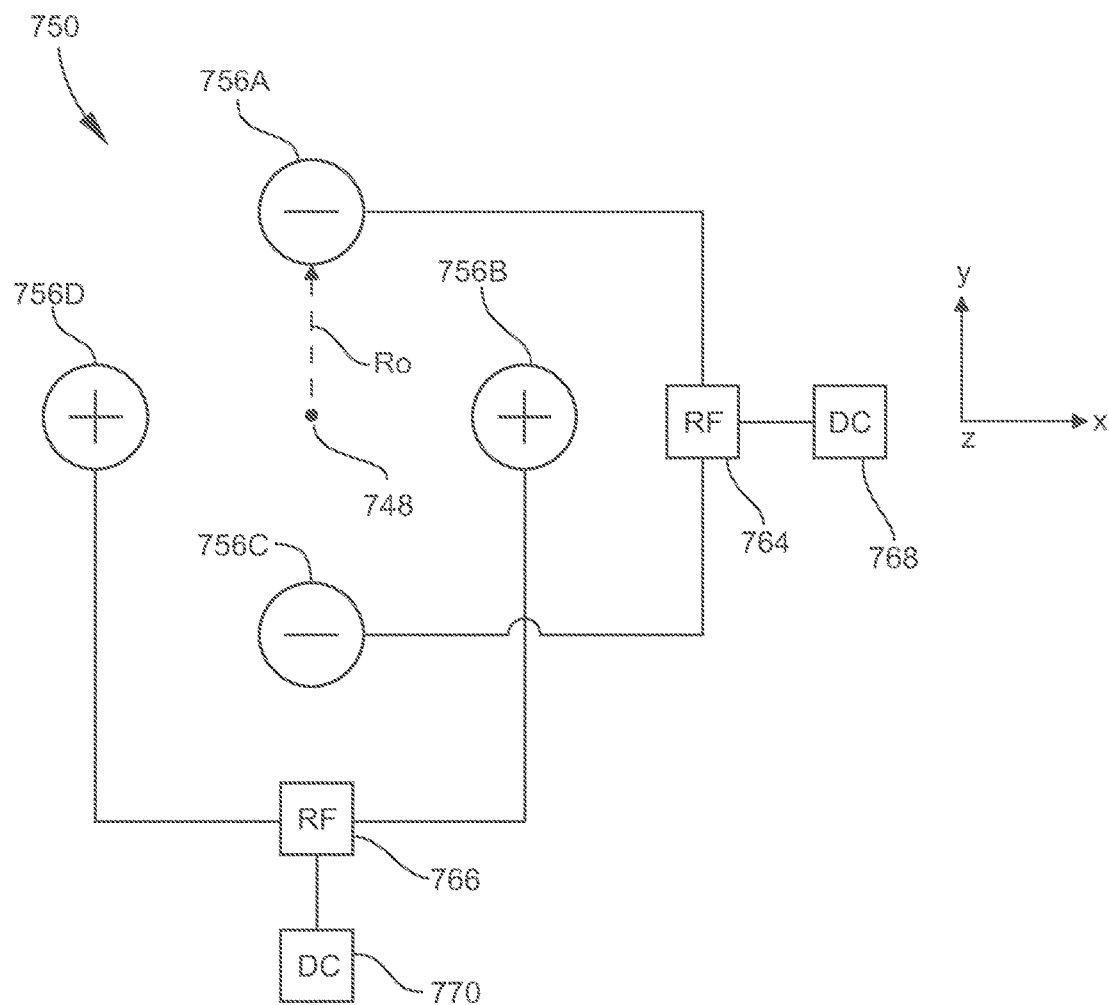
FIG. 7B is a schematic cross-sectional view of the quadrupole ion guide assembly in the transverse (x-y) plane, taken along line B-B in FIG. 7A.

In the embodiments specifically illustrated in FIGS. 6-7B, the multipole electrode assembly is a quadrupole assembly. However, it will be understood that the multipole electrode assembly may alternatively be a hexapole assembly, an octopole assembly, or a higher-order assembly (decapole assembly, dodecapole assembly, etc.).

The quadrupole electrode assembly may include four parallel electrodes (or "ion guide" electrodes, and often termed "rods") elongated along (e.g., in parallel with) an ion guide axis (e.g., the z-axis), also referred to as an electrode assembly axis. The guide electrodes are positioned around the guide axis at a radial distance $R_0$ therefrom, thus surrounding an ion guide volume (space) that is likewise elongated along the guide axis. The guide electrodes are spaced from each other in the transverse plane (e.g., x-y plane) orthogonal to the guide (z) axis. This type of electrode arrangement may be referred to as a linear multipole geometry. Typically, the guide axis is a central axis of symmetry of the spatial arrangement of the guide electrodes in the transverse plane, and the guide electrodes may be said to be circumferentially spaced about the guide axis and to inscribe a cylindrical guide volume of circular cross-section. The guide electrodes extend along the guide axis between two opposing axial ends, one serving as an ion entrance end and the other serving as an ion exit end. In the present context, the terms "cylindrical" and "circular" are used for simplified illustrative purposes, it being understood that the outer envelope of the volume able to be occupied by ions within the electrode assembly does not necessarily conform to exact shapes such as a cylinder or circle.

The quadrupole ion guide is configured to generate a quadrupole radio frequency (RF) electric field or composite quadrupole radio frequency/direct current (RF/DC) electric field in the guide volume. A high-voltage RF signal generating system (e.g., the high-voltage RF signal generating system 100 shown in FIG. 1) as described herein may be configured to supply the RF power (or both RF and DC power) to the electrodes of the quadrupole ion guide. The quadrupole RF field generated by the quadrupole ion guide is a two-dimensional ion confining field, in that it constrains ion motion in the radial directions (transverse or x-y plane). Ions that are stable in the ion confining field are focused as a beam in the vicinity of the guide axis and are able to traverse the full axial length of the ion guide and pass through the ion exit end. On the other hand, ions that are unstable in the ion confining field are lost due to overcoming the ion confining field and impacting the guide electrodes. The parameters of the ion confining field may be set such that the quadrupole ion guide is mass-selective, whereby ions of a selected mass-to-charge (m/z) ratio or range of m/z ratios are stable while other ions are unstable. Examples of mass-selective quadrupole ion guides include mass filters and linear (two-dimensional) ion traps.

As illustrated in FIG. 6, the MS system 600 may generally include, in order of ion process flow, an ion source 604, at least one mass analyzer 608 downstream from the ion source 604, and an ion detector 612 positioned to receive ions from the mass analyzer 608. From the perspective of FIG. 6, the MS system 600 defines a flow path for ions and gas molecules successively through the foregoing devices generally in the direction from left to right, as depicted by horizontal arrows. The MS system 600 also includes a vacuum system (not shown) for maintaining various interior regions of the MS system 600 at controlled, sub-atmospheric pressure levels. As appreciated by persons skilled in the art, the vacuum system may include vacuum lines communicating with the various interior regions via vacuum ports or exhaust ports, one or more vacuum-generating pumps, and associated components. The vacuum lines may also remove non-analytical neutral molecules from the ion path of the MS system 600. For simplicity, additional ion processing devices, ion optics, electronics, and other hardware that may be included in the MS system 600 are not shown. For example, in some embodiments the MS system 600 may include an ion mobility analyzing stage as appreciated by persons skilled in the art.

One or more of the boxes 604, 628, 620, 632, 624, 636, 608, 640, and 612 in FIG. 6 may be considered as schematically depicting a vacuum housing associated with a particular one or more of the ion processing devices. The vacuum housing may communicate with one or more vacuum lines of the vacuum system. The vacuum housing may enclose components of the ion processing device, which components may include the electrodes of an electrode assembly as disclosed herein. Thus, in an embodiment of the present disclosure, an ion processing device may include an electrode assembly (e.g., a system for generating a radio frequency ("RF") output signal at high voltage as described herein), and a plurality of electrodes, wherein one or more of the electrodes communicate with the system and are configured to receive the RF output signal), and a vacuum housing, with at least the electrodes of the electrode assembly being positioned in the vacuum housing. The electrodes may define or be part of the ion process flow, or ion flow path, through the MS system 600.

The ion source 604 may be any type of continuous-beam or pulsed ion source suitable for producing analyte ions for spectrometry, as appreciated by persons skilled in the art. Depending on the type of ionization implemented, the ion source 604 may operate at vacuum, or at or near atmospheric pressure. Examples of ion sources include, but are not limited to, electron ionization (EI) sources, chemical ionization (CI) sources, photo-ionization (PI) sources, electrospray ionization (ESI) sources, atmospheric pressure chemical ionization (APCI) sources, atmospheric pressure photo-ionization (APPI) sources, field ionization (FI) sources, plasma or corona discharge sources, laser desorption ionization (LDI) sources, and matrix-assisted laser desorption ionization (MALDI) sources. Sample material to be analyzed may be introduced to the ion source 604 by any suitable means, including hyphenated techniques in which the sample material is an output 616 from an analytical separation instrument such as, for example, a gas chromatography (GC) or liquid chromatography (LC) instrument (not shown).

In some embodiments, at least one mass analyzer (e.g., the mass analyzer 608) is based on a multipole electrode assembly, such as a quadrupole rod assembly, as described further below.

The ion detector 612 may be any device configured for collecting and measuring the flux (or current) of mass-discriminated ions outputted from the mass analyzer 608. Examples of ion detectors include, but are not limited to, multi-channel detectors (e.g., micro-channel plate (MCP) detectors), electron multipliers, photomultipliers, image current detectors, and Faraday cups.

In general operation, sample molecules are introduced into the ion source 604, and the ion source 604 produces ions from the sample molecules and transmits the ions to the mass analyzer 608. The mass analyzer 608 selectively transmits the ions to the ion detector 612 on the basis of mass-to-charge (m/z) ratio, the specific mechanism of mass selection or filtering being dependent on the type of mass analyzer as appreciated by persons skilled in the art. The ion detector 612 receives the ions and produces ion measurement signals from which a mass spectrum of the sample is constructed.

As also illustrated in FIG. 6, in some embodiments the MS system 600 may be configured for implementing tandem MS (MS/MS). For example, the MS system 600 may be configured as a QqQ, qTOF, or QqTOF instrument. Here, "Q" traditionally designates a quadrupole mass filter or mass analyzer (although such device does not necessarily include a quadrupole), "q" traditionally designates an RF-only quadrupole device (although such device does not necessarily include a quadrupole, and more typically includes a higher-order multipole electrode assembly such as an octopole electrode assembly), and "TOF" refers to a time-of-flight based device. Thus, the MS system 600 may include a first mass analyzer 620 upstream of the mass analyzer 608 (the second, or final, mass analyzer in such embodiments), and an ion fragmentation device such as a collision cell 624 between the first mass analyzer 620 and the second mass analyzer 608. The first mass analyzer 620 is configured for selecting precursor ions of a specific m/z ratio or m/z ratio range and is typically, but not necessarily, configured as a quadrupole mass filter. The collision cell 624 typically includes a non-mass-resolving, RF-only multipole ion guide (typically of higher order than a quadrupole, such as hexapole or octopole) enclosed in a cell. The cell is pressurized by an inert gas to a level sufficient for producing fragment ions from the precursor ions by collision-induced dissociation (CID) as appreciated by persons skilled in the art. However, a fragmentation device other than a CID-based device may be utilized such as, for example, a device configured for implementing electron capture dissociation (ECD), electron transfer dissociation (ETD), or infrared multiphoton dissociation (IRMPD). The second mass analyzer 608 then resolves the fragment ions on the basis of mass (m/z ratio) and transmits the mass-resolved fragment ions to the ion detector 612, which outputs measurement signals from which mass spectra are then produced.

In tandem MS embodiments, both the first mass analyzer 620 and the second mass analyzer 608 may be based on a linear quadrupole electrode structure. Alternatively, the second mass analyzer 608 may be another type of mass analyzer such as, for example, a three-dimensional Paul trap, a time-of-flight (TOF) analyzer, an electrostatic trap (e.g. Kingdon, Knight, or ORBITRAP® trap), a static electric and/or magnetic field sector instrument, or an ion cyclotron resonance (ICR) cell (Fourier transform-ICR (FT-ICR) or Fourier transform mass spectrometer (FTMS), also known as a Penning trap).

As further illustrated in FIG. 6, one or more of the ion processing devices (e.g., first mass analyzer 620, collision cell 624, second mass analyzer 608, or other ion guides not specifically shown) may be preceded or succeeded by ion optics 628, 632, 636, and 640. The ion optics 628, 632, 636, and 640 may include various types of lens elements such as, for example, aperture lenses (ring electrodes centered on-axis, plate electrodes with apertures centered on-axis, split-plate or split-cylinder electrodes with open slots or gaps centered on-axis), parallel plate electrodes, multipole rod electrodes, etc.

The MS system 600 may also include a computing device (or system controller) 644. The computing device 644 is schematically depicted as representing one or more modules (or units, or components) configured for controlling, monitoring and/or timing various functional aspects of the MS system 600 described above. One or more modules of the computing device 644 may be, or be embodied in, for example, a desktop computer, laptop computer, portable computer, tablet computer, handheld computer, mobile computing device, personal digital assistant (PDA), smartphone, etc. In particular, the computing device 644 may control the operation of one or more RF signal generating systems 100 provided in the MS system 600, and thus may communicate with one or more components of the RF signal generating system 100 described herein. The computing device 644 may also schematically represent all voltage sources not specifically shown, as well as timing controllers, clocks, frequency/waveform generators and the like as needed for applying voltages to various components of the MS system 600. The computing device 644 may also be configured for receiving the ion detection signals from the ion detector 612 and performing tasks relating to data acquisition and signal analysis as necessary to generate chromatograms, drift spectra, and mass (m/z ratio) spectra characterizing the sample under analysis. The computing device 644 may also be configured for providing and controlling a user interface that provides screen displays of spectrometric data and other data with which a user may interact. The computing device 644 may include one or more reading devices on or in which a tangible, non-transitory computer-readable (machine-readable) medium may be loaded that includes instructions for performing all or part of any of the methods disclosed herein. For all such purposes, the computing device 644 may be in signal communication with various components of the MS system 600 via wired or wireless communication links (as partially represented, for example, by a dashed line between the computing device 644 and one or more RF signal generating systems 100). Also for these purposes, the computing device 644 may include one or more types of hardware, firmware and/or software, as well as one or more processors, memories and databases.

As noted above, the mass analyzer 620, collision cell 624, and/or second mass analyzer 608 may include an electrode assembly such as a multipole electrode assembly. One or more of these electrode assemblies may be powered by one or more one or more RF signal generating systems 100. By example, FIG. 6 schematically depicts a single RF signal generating system 100 communicating with the electrodes of the mass analyzer 620, the collision cell 624, and the second mass analyzer 608. It will be understood, however, that the mass analyzer 620, the collision cell 624, and the second mass analyzer 608 may be powered by respective, discrete (or separate) RF signal generating systems 100.

FIG. 7A is a schematic side (lengthwise) view of an example of a quadrupole ion guide assembly 700 according to some embodiments. For descriptive purposes, FIG. 7A includes a Cartesian frame of reference consisting of mutually orthogonal x-, y-, and z-axes, which may also be referred to as x-, y-, and z-directions. The z-axis corresponds to an ion guide axis 748 (or assembly axis) along which ions flow (the horizontal axis in FIG. 7A), which typically is a central axis of symmetry of the ion guide assembly 700. The x- and y-axes lie in a transverse (x-y) plane orthogonal to the ion guide axis 748. FIG. 7A is a view in the y-z plane. The quadrupole ion guide assembly 700 may generally include a quadrupole ion guide 750.

FIG. 7B is a schematic cross-sectional view of the quadrupole ion guide 750 in the transverse (x-y) plane, taken along line B-B in FIG. 7A. Referring to FIGS. 7A and 7B, the quadrupole ion guide 750 includes four ion guide electrodes 756A, 756B, 756C, and 756D elongated along the ion guide axis 748 and spaced from each other about the ion guide axis 748 in the transverse plane. By this configuration, the ion guide electrodes 756A, 756B, 756C, and 756D surround an axially elongated ion guide volume of inscribed radius $R_0$ in which ions may be radially confined. The ion guide electrodes 756A, 756B, 756C, and 756D extend between two opposing axial ends, i.e., from an ion entrance end 758 leading into the guide volume to an ion exit end 760 leading out from the guide volume. In the illustrated embodiment, the ion guide electrodes 756A, 756B, 756C, and 756D are arranged as a quadrupole comprising a first diametrically opposing pair of electrically interconnected ion guide electrodes 756A and 756C (or "Y" electrodes), and a second diametrically opposing pair of electrically interconnected ion guide electrodes 756B and 756D (or "X" electrodes), the latter of which for clarity are not shown in FIG. 7A. One or more lenses 752 may be provided at the ion entrance end 758, and one or more lenses 792 may be provided at the ion exit end 760. Lenses 752 and 792 may be utilized to focus and guide ions into the ion entrance end 758 and out from the ion exit end 760, respectively. Additionally, lenses 752 and 792 may be utilized to axial DC potential barriers or gates, particularly when the quadrupole ion guide 750 is operated as an ion trap.

The quadrupole ion guide 750 may also include a main RF voltage source communicating with the ion guide electrodes 756A, 756B, 756C, and 756D, schematically depicted as a first main RF voltage source 764 communicating with the first opposing pair of ion guide electrodes 756A and 756C and a second main RF voltage source 766 communicating with the second opposing pair of ion guide electrodes 756B and 756D. The first RF voltage source 764 applies a first main RF potential of the general form $V_{RF,main} \cos(\Omega t - \varphi_1)$ to the first opposing pair of ion guide electrodes 756A and 756C, and the second RF voltage source 766 applies a second main RF potential also of the general form $V_{RF,main} \cos(\Omega t - \varphi_2)$ to the second opposing pair of ion guide electrodes 756B and 756D, where $V_{RF,main}$ is the amplitude of the RF drive potential, $\Omega$ is the main RF drive frequency, t is time, and $\varphi_1$ and $\varphi_2$ are the relative phases. The phase $\varphi_1$ of the first main RF potential is shifted 180 degrees ($\pi$ rads) from the phase $\varphi_2$ of the second main RF potential. Consequently, the ion guide electrodes 756A, 756B, 756C, and 756D generate a two-dimensional, quadrupole RF radial confining field. Between each interconnected electrode pair 756A/756C or 756B/56D, the RF confining field alternates between imparting a repelling force on the ions directed radially away from the electrode pair 756A/756C or 756B/56D and toward the ion guide axis 748, and an attractive force directed radially toward the electrode pair 756A/56C or 756B/56D and away from the ion guide axis 748.

The quadrupole ion guide 750 also typically includes a DC voltage source communicating with the ion guide electrodes 756A, 756B, 756C, and 756D, schematically depicted as a first main DC voltage source 768 communicating with the first opposing pair of ion guide electrodes 756A and 756C and a second main DC voltage source 770 communicating with the second opposing pair of ion guide electrodes 756B and 756D. The first main DC voltage source 768 applies a first main DC potential of magnitude $-U1_{DC,main}$ to the first opposing pair of ion guide electrodes 7256A and 756C, and the second main DC voltage source 770 applies a second main DC potential of magnitude $+U2_{DC,main}$ to the second opposing pair of ion guide electrodes 756B and 756D. The polarity of the first main DC potential is opposite to the polarity of the second main DC potential. In FIG. 7B, the DC polarities are indicated by the signs "−" and "+" on the ion guide electrode pairs 756A/756C and 756B/56D, respectively. The negative and positive DC biases applied to the electrode pairs 756A/756C and 756B/56D are constant, i.e., they do not alternate. Consequently, the ion guide electrodes 756A, 756B, 756C, and 756D generate a quadrupole DC field in the ion guide volume. The main quadrupole DC field is superimposed on the main RF quadrupole field, resulting in a composite RF/DC confining field generated in the ion guide volume. Thus, the total potentials applied to the ion guide electrodes 756A, 756B, 756C, and 756D may be expressed as follows:

first electrode pair 756A/756C: $-(V_{RF,main} \cos(\Omega t) + U1_{DC,main})$ and second electrode pair 756B/56D: $+(V_{RF,main} \cos(\Omega t) + U2DC,main)$.

In some embodiments, a DC offset may be added to the quadrupole voltage such that the overall magnitude of the first main DC potential $U1_{DC,main}$ is different from the overall magnitude of the second main DC potential $U2_{DC,main}$. For example, assuming the quadrupole voltage consists of −100 V applied to the first electrode pair 756A/756C and +100 V applied to the second electrode pair 756B/56D, and further assuming a DC offset of +15V, then the overall magnitude of the first main DC potential $U1_{DC,main}$ applied to the first electrode pair 756A/756C would be −85 V and the overall magnitude of the applied to the second electrode pair 756B/56D would be +115 V.

Thus, the quadrupole ion guide 750 may be configured to operate as a bandpass mass filter, in which the parameters of the RF/DC confining field $V_{RF,main}$, $\Omega$, and $U_{DC,main}$ are controlled to determine the mass range of ions that will have stable trajectories in the RF/DC confining field, as described further below. Stable ions are able to drift through the quadrupole ion guide 750 along the ion guide axis 748 and be transmitted out from the ion exit end 760 to a downstream device, whereas unstable ions are able to oscillate far enough in the radial directions to reach the ion guide electrodes 756A, 756B, 756C, and 756D and be neutralized and thus not be transmitted out from the ion exit end 760. Alternatively, the quadrupole ion guide 750 may be configured to operate as a linear ion trap as appreciated by persons skilled in the art, by utilizing ion lenses (e.g., lenses 752 and 792) to selectively add axial DC potential barriers at the axial ends of the quadrupole ion guide 750, and by utilizing various known techniques to selectively eject ions either axially or radially.

In some embodiments, the RF voltage sources 764 and 766, or both the RF voltage sources 764 and 766 and the DC voltage sources 768 and 770, may be representative of a system for generating a high-voltage RF output signal as described herein, such as the high-voltage RF signal generating system 100 illustrated in FIG. 1.

While in the present example the quadrupole ion guide 750 has a linear, or two-dimensional, geometry, alternatively the quadrupole ion guide 750 may have a three-dimensional (3D) geometry, particularly when configured as an ion trap. As an example of a 3D ion trap, the trap electrodes may include a pair of hyperbolic end-cap electrodes spaced apart from each other along the trap axis, and a hyperbolic ring electrode positioned between the end-cap electrodes and coaxially swept about the trap axis. The respective foci of the end-cap electrodes face each other and thus face the interior region of the 3D ion trap, and the focus of the ring electrode also faces the interior region. Application of an RF trapping voltage, such as by a high-voltage RF signal generating system 100 as described herein, thus generates a 3D trapping field that constrains the motion of ions to an ion cloud in the center of the interior region, which may be further reduced by a damping gas. The trap entrance and trap exit may be one or more apertures typically formed through the end-cap electrodes, or alternatively through the ring electrode. Examples of the structure and operation of 3D as well as 2D ion traps are described in, for example, U.S. Pat. No. 7,034,293, the content of which is incorporated by reference herein.

While in the present example the electrodes 756A, 756B, 756C, and 756D of the quadrupole ion guide 750 (or other type of multipole electrode assembly) are parallel to each other along the axis 748, in other embodiments the electrodes 756A, 756B, 756C, and 756D may converge toward each other or diverge away from each other along a given axial direction (e.g., from the entrance end to the exit end). With a converging geometry, the electrode assembly may function as an ion funnel, as appreciated by persons skilled in the art. As another alternative, the electrodes 756A, 756B, 756C, and 756D may be generally parallel but their diameters are varied along the axial direction such that the cross-sectional area of the interior region at the ion entrance is greater than the cross-sectional area at the ion exit, thereby providing a converging or diverging ion confining region. In another embodiment, the electrodes 756A, 756B, 756C, and 756D may be physically converging or diverging as shown in FIG. 3 and also have varying diameters. Examples of all such embodiments are described in, for example, U.S. Pat. No. 8,637,816; U.S. Pat. No. 9,053,915; and U.S. Pat. App. Pub. No. 2016/0211128; the contents of each of which are incorporated by reference herein.

While in the present example the electrodes 756A, 756B, 756C, and 756D are rod-shaped and elongated along the axis 748, in other embodiments the electrode assembly may have a stacked-ring geometry. In such case, the electrodes of electrode assembly are arranged in series, and spaced from each other, along the axis 748. Each electrode is shaped as a ring or a plate, in either case having an aperture that is typically centered on the axis 748. The sizes of the apertures may be constant or may vary. For example, the aperture of first electrode at the entrance end may have the largest cross-sectional area, the aperture of the last electrode at the exit end may have the smallest cross-sectional area, and the apertures of the intermediate electrodes may have one or more intermediate cross-sectional areas. The electrode apertures may reduce in cross-sectional area (e.g., reduce in diameter in the case of circular apertures)—and thus the cross-sectional area of the interior region may taper—in the direction of the exit, resulting in an ion funnel configuration. In typical implementations, an RF confining field, such as may be powered by a high-voltage RF signal generating system 100 as described herein, is produced by applying RF voltages to each electrode such that the RF voltage on any given electrode is 180 degrees out of the phase with the RF voltage on the adjacent cell electrode(s). In addition, DC voltages may be applied to the first electrode, last electrode, and one or more of the intermediate electrodes as needed to control the axial motion of the ions, including pulsing out to a downstream device if desired. In yet another embodiment, the electrodes of electrode assembly may be configured as an "RF carpet" arrangement. These electrode geometries generate a converging ion confining region as described herein. Examples of all such embodiments are described, for example, in above-referenced U.S. Pat. No. 8,637,816; U.S. Pat. No. 9,053,915; and U.S. Pat. App. Pub. No. 2016/0211128.

EXEMPLARY EMBODIMENTS

Exemplary embodiments provided in accordance with the presently disclosed subject matter include, but are not limited to, the following:
1. A system for generating a radio frequency ("RF") output signal at a high voltage, the system comprising: an oscillator configured to generate a drive signal at a drive frequency; a RF amplifier configured to amplify the drive signal to generate an amplified drive signal at the drive frequency; a resonator comprising a tuning component connected to receive the amplified drive signal from the RF amplifier, wherein the amplified drive signal drives the resonator to generate a magnified RF output signal at the same frequency as the drive signal based at least in part on a resonance parameter of the tuning component that varies with a tuning component temperature, wherein the resonant frequency is substantially equal to the drive frequency depending on the tuning component temperature, and wherein the RF output signal has a magnified amplitude due to a resonant voltage step-up provided by the resonator when the resonant frequency is substantially equal to the frequency of the drive signal; a temperature changing element configured to heat or cool the tuning component to change the tuning component temperature; and a resonance tuning controller configured to determine when the resonant frequency and the drive frequency are different, and to control the temperature changing element to change the resonance parameter to tune the resonant frequency to be substantially equal to the drive frequency.
2. The system of embodiment 1, wherein the resonator is an LC resonator and the tuning component is a tuning capacitor, wherein the resonance parameter of the LC resonator is a capacitance of the tuning capacitor and wherein the capacitance varies with the tuning component temperature.
3. The system of embodiment 1, wherein the resonator is an LC resonator and the tuning component is a tuning inductor, wherein the resonance parameter of the LC resonator is an inductance of the tuning inductor and wherein the inductance varies with the tuning component temperature.
4. The system of any of the preceding embodiments, wherein the resonance tuning controller comprises a field-programmable gate array ("FPGA") programmed to generate the temperature control signal in response to determining the resonant frequency and the drive frequency are different.
5. The system of any of the preceding embodiments, further comprising: a temperature monitoring element positioned to sense heat radiated from the temperature changing element and to generate an electrical signal level corresponding to the sensed heat from the temperature changing element.
6. The system of any of the preceding embodiments, wherein the resonator receives the drive voltage at a RF amplifier output and generates a magnified RF voltage at a resonator output, and the resonance tuning controller is configured to detect a phase shift between the RF voltage at the resonator output and the RF voltage at the RF amplifier output.
7. The system of embodiment 6, wherein the resonator receives the drive voltage at a RF amplifier output and generates a magnified RF voltage at a resonator output, and the phase between the drive voltage at the RF amplifier output and the RF voltage at the resonator output is 90° when the drive frequency and the resonant frequency are the same, and wherein the resonance tuning controller is configured to detect the phase shift by detecting a phase greater than 90° when the resonant frequency is less than the drive frequency, and a phase less than 90° when the resonant frequency is greater than the drive frequency.
8. The system of any of embodiments 1 to 5, where the resonance tuning controller includes a first map of temperature changes corresponding to power levels and a second map of values of the resonance parameter corresponding to temperature changes, where the resonance tuning controller determines the difference between the resonant frequency and the drive frequency by looking up a temperature change corresponding to a change in power level and looking up a value for the resonance parameter corresponding to the temperature change.
9. The system of any of embodiments 1 to 7, wherein the resonance tuning controller comprises a first resonance tuning controller input and a second resonance tuning controller input, and further comprising: a first analog-to-digital converter ("ADC") connected between the RF amplifier output and the first resonance tuning controller input; a second ADC connected between the resonator output and the second resonance tuning controller input; wherein the resonance tuning controller compares a first plurality of digital values received from the first ADC with a second plurality of digital values received from the second ADC to determine the phase between the RF amplifier output and the resonator output.
10. The system of embodiments 6 or 7, further comprising: a first voltage scaler connected between the RF amplifier output and a first resonance tuning controller input; a second voltage scaler connected between the resonator output and a second resonance tuning controller input; wherein the resonance tuning controller includes a controller clock to generate clock signals, and a zero-crossing counter to count clock signals between zero crossings of the signals at the first and second resonance tuning controller inputs to determine the phase between the RF amplifier output and the resonator output.

11. The system of any of the preceding embodiments, wherein the oscillator is a component of the resonance tuning controller.
12. The system of embodiments 1 or 4 to 11, wherein the tuning component is any reactive component characterized by a temperature coefficient indicating a change in reactance per change in temperature.
13. The system of embodiments 2 or 4 to 12, wherein the tuning capacitor having a ceramic dielectric or a polypropylene dielectric.
14. The system of any of the preceding embodiments, wherein the temperature changing element includes a cooling element configured to cool the tuning component in response to receiving a temperature control signal.
15. The system of any of the preceding embodiments, wherein the temperature changing element includes a heating element configured to heat the tuning component in response to receiving a temperature control signal.
16. The system of any of the preceding embodiments, wherein the temperature changing element includes a thermoelectric generator configured to heat or cool the tuning component in response to receiving a temperature control signal.
17. The system of any of the preceding embodiments, further comprising: a digital to analog converter ("DAC") connected to receive a digital value corresponding to a heater setting from the resonance tuning controller and configured to convert the digital value to a voltage level at the temperature changing element.
18. A method for providing a radio frequency ("RF") output signal at a high voltage, the method comprising: generating an amplified drive signal using an RF amplifier connected to an oscillator generating an RF signal at a drive frequency; driving a resonator using the amplified drive signal to generate the RF output signal at a resonant frequency substantially equal to the drive frequency depending on a tuning component temperature; detecting a difference between the resonant frequency and the drive frequency; and heating the tuning component to tune the resonator frequency to be substantially equal to the drive frequency in response to the detecting of the difference between the resonant frequency and the drive frequency.
19. The method of embodiment 18, wherein the step of heating the resonator comprises heating or cooling a tuning capacitor in an LC resonant circuit to adjust the resonant frequency by changing the capacitance of the tuning capacitor.
20. The method of embodiment 18, wherein the step of heating the resonator comprises applying a current to a temperature changing element.
21. The method of embodiment 20, further comprising: sensing the tuning component temperature using a temperature monitoring element; and adjusting the current applied to the temperature changing element to obtain a selected tuning component temperature.
22. The method of any of embodiments 18 to 21, wherein the step of detecting the difference between the resonant frequency and drive frequency comprises: detecting a phase shift between the RF voltage at a resonator output and the drive voltage at a RF amplifier output.
23. The method of embodiment 22, wherein the phase between a RF amplifier output and a resonator output is 90° when the drive frequency and the resonant frequency are the same, the method further comprising: detecting a phase greater than 90° when the resonant frequency is less than the drive frequency, and a phase less than 90° when the resonant frequency is greater than drive frequency.
24. The method of embodiment 23, wherein a first analog-to-digital converter ("ADC") is connected between the RF amplifier output and a first resonance tuning controller input, and a second ADC is connected between the resonator output and a second resonance tuning controller input, the method further comprising: comparing a first plurality of digital values received from the first ADC with a second plurality of digital values received from the second ADC to determine the phase between the RF amplifier output and the resonator output.
25. The method of embodiment 24, wherein a first voltage scaler is connected between the RF amplifier output and a first resonance tuning controller input, and a second voltage scaler is connected between the resonator output and a second resonance tuning controller input, the method further comprising: counting clock signals between zero crossings of the RF signals at the first and second resonance tuning controller inputs to determine the phase between the RF amplifier output and the resonator output.
26. The method of embodiment 20, further comprising: generating a digital value corresponding to a temperature setting; converting the digital value to a voltage level; and
applying the voltage level at the temperature changing element.
27. The method of any of embodiments 18 to 26, wherein the temperature changing element includes a cooling element configured to cool the tuning component in response to receiving a temperature control signal.
28. The method of any of embodiments 18 to 27, wherein the temperature changing element includes a heating element configured to heat the tuning component in response to receiving a temperature control signal.
29. The method of embodiment 18 to 28, wherein the temperature changing element includes a thermoelectric generator configured to heat or cool the tuning component in response to receiving a temperature control signal.
30. An electrode assembly, comprising: the system for generating a radio frequency ("RF") output signal of any of embodiments 1 to 17; and a plurality of electrodes, wherein one or more of the electrodes communicate with the system and are configured to receive the RF output signal.
31. The electrode assembly of embodiment 30, wherein the electrodes are arranged to surround an interior space, such that the electrode assembly comprises an entrance communicating with the interior space and an exit communicating with the interior space.
32. The electrode assembly of embodiment 30, wherein the electrodes are arranged as a linear ion guide.
33. The electrode assembly of embodiment 30, wherein the entrance and the exit are spaced from each other along an axis, and the electrodes are elongated along the axis and circumferentially spaced from each other about the axis
34. The electrode assembly of embodiment 33, wherein the electrodes have a configuration selected from the group consisting of: the electrodes are parallel to each other; the electrodes converge toward each other in a direction along the axis toward the exit; the electrodes diverge away from each other; a combination of two or more of the foregoing.

35. The electrode assembly of embodiment 30, wherein the entrance and the exit are spaced from each other along an axis, the electrodes are spaced from each other along the axis, and the electrodes comprise respective apertures on the axis.

36. The electrode assembly of embodiment 30, wherein the electrodes are arranged as an ion funnel.

37. The electrode assembly of embodiment 30, comprising a direct current (DC) voltage source configured for applying DC potentials to one or more of the electrodes.

38. The electrode assembly of any of embodiment 30, wherein the plurality of electrodes comprises at least a first electrode pair spaced from each other along a first transverse axis, and a second electrode pair spaced from each other along a second transverse axis.

39. The electrode assembly of embodiment 38, wherein the first electrode pair comprises two electrically interconnected electrodes, and the second electrode pair comprises two electrically interconnected electrodes.

40. The electrode assembly of embodiment 30, wherein the electrodes are arranged as a three-dimensional configuration, such that the electrode assembly comprises a ring electrode surround an axis, a first end cap electrode positioned on the axis, and a second end cap electrode positioned on the axis and facing the first end cap electrode, wherein the ring electrode is positioned between the first end cap electrode and the second end cap electrode.

41. The electrode assembly of embodiment 30, wherein the plurality of electrodes is part of an ion processing device selected from the group consisting of: an ion guide; an ion trap; a mass filter; a mass analyzer; an ion fragmentation device; an ion beam cooler; an ion beam focusing device; and an ion beam shaper.

42. An ion processing device, comprising: the electrode assembly of embodiment 30; and a vacuum chamber, wherein the plurality of electrodes is positioned in the vacuum chamber.

43. A mass spectrometer (MS), comprising: the electrode assembly of embodiment 30; and an ion detector.

44. The MS of embodiment 43, wherein the electrode assembly is configured to output ions, and the ion detector is configured to receive ions outputted from the electrode assembly.

45. The MS of embodiment 43, comprising an ion source.

46. The MS of embodiment 45, wherein the ion source is configured to output ions, and the electrode assembly is configured to receive ions outputted from the ion source 47. The MS of embodiment 43, comprising an ion processing device, wherein the ion processing device comprises the electrode assembly.

48. The MS of embodiment 47, wherein the ion processing device is selected from the group consisting of: an ion guide; an ion trap; a mass filter; a mass analyzer; an ion fragmentation device; an ion beam cooler; an ion beam focusing device; and an ion beam shaper.

It will be understood that one or more of the processes, sub-processes, and process steps described herein may be performed by hardware, firmware, software, or a combination of two or more of the foregoing, on one or more electronic or digitally-controlled devices. The software may reside in a software memory (not shown) in a suitable electronic processing component or system such as, for example, the system controller 644 schematically depicted in FIG. 6. The software memory may include an ordered listing of executable instructions for implementing logical functions (that is, "logic" that may be implemented in digital form such as digital circuitry or source code, or in analog form such as an analog source such as an analog electrical, sound, or video signal). The instructions may be executed within a processing module, which includes, for example, one or more microprocessors, general purpose processors, combinations of processors, digital signal processors (DSPs), application specific integrated circuits (ASICs), field-programmable gate array (FPGAs), etc. Further, the schematic diagrams describe a logical division of functions having physical (hardware and/or software) implementations that are not limited by architecture or the physical layout of the functions. The examples of systems described herein may be implemented in a variety of configurations and operate as hardware/software components in a single hardware/software unit, or in separate hardware/software units.

The executable instructions may be implemented as a computer program product having instructions stored therein which, when executed by a processing module of an electronic system (e.g., the system controller 644 in FIG. 6), direct the electronic system to carry out the instructions. The computer program product may be selectively embodied in any non-transitory computer-readable storage medium for use by or in connection with an instruction execution system, apparatus, or device, such as an electronic computer-based system, processor-containing system, or other system that may selectively fetch the instructions from the instruction execution system, apparatus, or device and execute the instructions. In the context of this disclosure, a computer-readable storage medium is any non-transitory means that may store the program for use by or in connection with the instruction execution system, apparatus, or device. The non-transitory computer-readable storage medium may selectively be, for example, an electronic, magnetic, optical, electromagnetic, infrared, or semiconductor system, apparatus, or device. A non-exhaustive list of more specific examples of non-transitory computer readable media include: an electrical connection having one or more wires (electronic); a portable computer diskette (magnetic); a random access memory (electronic); a read-only memory (electronic); an erasable programmable read only memory such as, for example, flash memory (electronic); a compact disc memory such as, for example, CD-ROM, CD-R, CD-RW (optical); and digital versatile disc memory, i.e., DVD (optical). Note that the non-transitory computer-readable storage medium may even be paper or another suitable medium upon which the program is printed, as the program may be electronically captured via, for instance, optical scanning of the paper or other medium, then compiled, interpreted, or otherwise processed in a suitable manner if necessary, and then stored in a computer memory or machine memory.

It will also be understood that the term "in signal communication" or "in electrical communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

More generally, terms such as "communicate" and "in . . . communication with" (for example, a first component "communicates with" or "is in communication with" a second component), or "connect," "connected" or "connection," are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A system for generating a radio frequency ("RF") output signal at a high voltage, the system comprising:
   an oscillator configured to generate a drive signal at a drive frequency;
   a RF amplifier configured to amplify the drive signal to generate an amplified drive signal at the drive frequency;
   a resonator comprising a tuning component connected to receive the amplified drive signal from the RF amplifier, wherein the amplified drive signal drives the resonator to generate a magnified RF output signal at the same frequency as the drive signal based at least in part on a resonance parameter of the tuning component that varies with a tuning component temperature, wherein the resonant frequency is substantially equal to the drive frequency depending on the tuning component temperature, and wherein the RF output signal has a magnified amplitude due to a resonant voltage step-up provided by the resonator when the resonant frequency is substantially equal to the frequency of the drive signal;
   a temperature changing element configured to heat or cool the tuning component to change the tuning component temperature; and
   a resonance tuning controller configured to determine when the resonant frequency and the drive frequency are different, and to control the temperature changing element to change the resonance parameter to tune the resonant frequency to be substantially equal to the drive frequency.

2. The system of claim 1, wherein the resonator is an LC resonator and the tuning component is a tuning capacitor, wherein the resonance parameter of the LC resonator is a capacitance of the tuning capacitor and wherein the capacitance varies with the tuning component temperature.

3. The system of claim 1, wherein the resonator is an LC resonator and the tuning component is a tuning inductor, wherein the resonance parameter of the LC resonator is an inductance of the tuning inductor and wherein the inductance varies with the tuning component temperature.

4. The system of claim 1, wherein the resonance tuning controller comprises a field-programmable gate array ("FPGA") programmed to generate the temperature control signal in response to determining the resonant frequency and the drive frequency are different.

5. The system of claim 1, further comprising:
   a temperature monitoring element positioned to sense heat radiated from the temperature changing element and to generate an electrical signal level corresponding to the sensed heat from the temperature changing element.

6. The system of claim 1, wherein the resonator receives the drive voltage at a RF amplifier output and generates a magnified RF voltage at a resonator output, and the resonance tuning controller is configured to detect a phase shift between the RF voltage at the resonator output and the RF voltage at the RF amplifier output.

7. The system of claim 6, wherein the resonator receives the drive voltage at a RF amplifier output and generates a magnified RF voltage at a resonator output, and the phase between the drive voltage at the RF amplifier output and the RF voltage at the resonator output is 90° when the drive frequency and the resonant frequency are the same, and wherein the resonance tuning controller is configured to detect the phase shift by detecting a phase greater than 90° when the resonant frequency is less than the drive frequency, and a phase less than 90° when the resonant frequency is greater than the drive frequency.

8. The system of claim 6, wherein the resonance tuning controller comprises a first resonance tuning controller input and a second resonance tuning controller input, and further comprising:
   a first analog-to-digital converter ("ADC") connected between the RF amplifier output and the first resonance tuning controller input;
   a second ADC connected between the resonator output and the second resonance tuning controller input;
   wherein the resonance tuning controller compares a first plurality of digital values received from the first ADC with a second plurality of digital values received from the second ADC to determine the phase between the RF amplifier output RF amplifier output and the resonator output.

9. The system of claim 6, further comprising:
   a first voltage scaler connected between the RF amplifier output and a first resonance tuning controller input;
   a second voltage scaler connected between the resonator output and a second resonance tuning controller input;
   wherein the resonance tuning controller includes a controller clock to generate clock signals, and a zero-crossing counter to count clock signals between zero crossings of the signals at the first and second resonance tuning controller inputs to determine the phase between the RF amplifier output and the resonator output.

10. The system of claim 1 where the resonance tuning controller includes a first map of temperature changes corresponding to power levels and a second map of values of the resonance parameter corresponding to temperature changes, where the resonance tuning controller determines the difference between the resonant frequency and the drive frequency by looking up a temperature change corresponding to a change in power level and looking up a value for the resonance parameter corresponding to the temperature change.

11. The system of claim 1, wherein the oscillator is a component of the resonance tuning controller.

12. The system of claim 1, wherein the tuning component is any reactive component characterized by a temperature coefficient indicating a change in reactance per change in temperature.

13. The system of claim 2, wherein the tuning capacitor having a ceramic dielectric or a polypropylene dielectric.

14. The system of claim 1 wherein the temperature changing element includes a cooling element configured to cool the tuning component in response to receiving a temperature control signal.

15. The system of claim 1 wherein the temperature changing element includes a heating element configured to heat the tuning component in response to receiving a temperature control signal.

16. The system of claim 1 wherein the temperature changing element includes a thermoelectric generator configured to heat or cool the tuning component in response to receiving a temperature control signal.

17. The system of claim 1, further comprising:
a digital to analog converter ("DAC") connected to receive a digital value corresponding to a heater setting from the resonance tuning controller and configured to convert the digital value to a voltage level at the temperature changing element.

18. A method for providing a radio frequency ("RF") output signal at a high voltage, the method comprising:
generating an amplified drive signal using an RF amplifier connected to an oscillator generating an RF signal at a drive frequency;
driving a resonator using the amplified drive signal to generate the RF output signal at a resonant frequency substantially equal to the drive frequency depending on a tuning component temperature;
detecting a difference between the resonant frequency and the drive frequency; and
heating the tuning component to tune the resonator frequency to be substantially equal to the drive frequency in response to the detecting of the difference between the resonant frequency and the drive frequency.

19. The method of claim 18, wherein the step of heating the resonator comprises heating or cooling a tuning capacitor in an LC resonant circuit to adjust the resonant frequency by changing the capacitance of the tuning capacitor.

20. The method of claim 18, wherein the step of heating the resonator comprises applying a current to a temperature changing element.

* * * * *